United States Patent
Amou et al.

(10) Patent No.: US 9,034,475 B2
(45) Date of Patent: May 19, 2015

(54) THERMOSETTING ADHESIVE COMPOSITION, AND HEAT RESISTANT ADHESIVE FILM AND WIRING FILM USING THE SAME

(71) Applicants: Hitachi Cable, Ltd., Chiyoda-ku, Tokyo (JP); Hitachi Cable Fine-Tech, Ltd., Hitachi-shi, Ibaraki (JP)

(72) Inventors: Satoru Amou, Hitachi (JP); Tomiya Abe, Hitachi (JP); Daisuke Shanai, Hitachi (JP); Hiroaki Komatsu, Hitachi (JP); Kenichi Murakami, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 153 days.

(21) Appl. No.: 13/770,225

(22) Filed: Feb. 19, 2013

(65) Prior Publication Data

US 2013/0220677 A1   Aug. 29, 2013

(30) Foreign Application Priority Data

Feb. 23, 2012   (JP) .................. 2012-037306

(51) Int. Cl.
*B32B 27/08*   (2006.01)
*B32B 27/18*   (2006.01)
(Continued)

(52) U.S. Cl.
CPC .............. *C09J 171/00* (2013.01); *C09J 181/06* (2013.01); *B32B 5/00* (2013.01); *H05K 1/02* (2013.01);
(Continued)

(58) Field of Classification Search
CPC ...... C09J 163/00; C09J 171/00; C09J 171/08; C09J 171/10; C09J 2205/00; C09J 2205/10; C08K 7/00; C08K 7/02; C08K 7/04; C08K 7/06; C08K 7/08; C08K 7/10; C08K 2201/003; C08K 2201/004; B32B 27/08; B32B 27/20; B32B 27/26; B32B 27/28; B32B 27/281; B32B 27/285; B32B 27/38; H05K 1/0353; H05K 3/386
USPC ............... 523/440, 442, 443, 444; 428/297.4, 428/300.1, 300.7, 301.4, 323, 328, 330, 428/331, 332, 334, 335, 336, 337, 339, 413, 428/473.5
See application file for complete search history.

(56) References Cited

U.S. PATENT DOCUMENTS

| | | |
|---|---|---|
| 5,290,614 A | 3/1994 | Narushima et al. |
| 5,298,304 A | 3/1994 | Narushima et al. |

(Continued)

FOREIGN PATENT DOCUMENTS

| | | |
|---|---|---|
| CN | 1392892 A | 1/2003 |
| EP | 1 850 351 B1 | 2/2011 |

(Continued)

OTHER PUBLICATIONS

Chinese Office Action dated Mar. 4, 2014, with English translation (Twenty-one (21) pages).

(Continued)

*Primary Examiner* — Michael J Feely
(74) *Attorney, Agent, or Firm* — Crowell & Moring LLP

(57) ABSTRACT

Provided are a thermosetting adhesive composition excellent in storage stability, reliability, and low-temperature adhesion properties; and a curl-resistant heat-resistant film and a wiring film obtained using the composition. The thermosetting adhesive composition includes 100 parts by weight of a phenoxy resin having a bisphenol S skeleton in the structure thereof; 5 to 30 parts by weight of a maleimide compound containing a plurality of maleimide groups in the structure thereof; and 3 to 20 vol % of an inorganic needle-like filler. The heat resistant adhesive film is obtained by applying the thermosetting adhesive composition onto a polyimide film, followed by drying. The wiring film is obtained by placing a conductor wiring layer on the heat resistant adhesive film.

19 Claims, 10 Drawing Sheets

(51) Int. Cl.
- *B32B 27/20* (2006.01)
- *B32B 27/26* (2006.01)
- *B32B 27/28* (2006.01)
- *C09J 163/00* (2006.01)
- *C09J 171/10* (2006.01)
- *C08K 7/04* (2006.01)
- *C09J 171/00* (2006.01)
- *C09J 181/06* (2006.01)
- *B32B 5/00* (2006.01)
- *H05K 1/02* (2006.01)
- *H05K 3/38* (2006.01)
- *B32B 7/12* (2006.01)
- *B32B 15/08* (2006.01)
- *B32B 3/08* (2006.01)

(52) U.S. Cl.
CPC ............ *C08G 2650/54* (2013.01); *H05K 3/386* (2013.01); *H05K 2201/0209* (2013.01); *H05K 2201/0248* (2013.01); *B32B 7/12* (2013.01); *B32B 15/08* (2013.01); *B32B 27/08* (2013.01); *B32B 27/281* (2013.01); *B32B 3/08* (2013.01); *B32B 2307/306* (2013.01); *B32B 2307/7246* (2013.01); *B32B 2307/732* (2013.01); *B32B 2457/08* (2013.01)

(56) References Cited

U.S. PATENT DOCUMENTS

| | | |
|---|---|---|
| 5,523,137 A | 6/1996 | Sei et al. |
| 5,843,550 A | 12/1998 | Sei et al. |
| 5,945,188 A | 8/1999 | Sei et al. |
| 6,197,149 B1 * | 3/2001 | Kobayashi et al. ........... 156/305 |
| 2003/0078331 A1 | 4/2003 | Kim et al. |
| 2012/0138345 A1 | 6/2012 | Amou et al. |

FOREIGN PATENT DOCUMENTS

| | | |
|---|---|---|
| JP | 5-29399 A | 2/1993 |
| JP | 2000-281916 A | 10/2000 |
| JP | 2004-136631 A | 5/2004 |
| JP | 2006-196850 A | 7/2006 |
| JP | 2009-67934 A | 4/2009 |
| JP | 2010-143988 A | 7/2010 |
| JP | 2010-150437 A | 7/2010 |
| JP | 2012-116954 A | 6/2012 |
| WO | WO 02/28971 A1 | 4/2002 |

OTHER PUBLICATIONS

Japanese Office Action dated Feb. 17, 2015 with partial English-language translation (Five (5) pages).

* cited by examiner

× : PARTIALLY FILLED

○ : COMPLETELY FILLED

THERMOSETTING ADHESIVE COMPOSITION, AND HEAT RESISTANT ADHESIVE FILM AND WIRING FILM USING THE SAME

CLAIM OF PRIORITY

The present application claims priority from Japanese Patent application serial No. 2012-037306, filed on Feb. 23, 2012, the content of which is hereby incorporated by reference into this application.

BACKGROUND OF THE INVENTION

Field of the Invention

The present invention relates to a thermosetting adhesive composition, and a heat resistant adhesive film and a wiring film using the thermosetting adhesive composition.

In recent years, electronic devices have been decreased in size, thickness, and weight and wiring members used therefor have been required to realize multilayer wirings, fine wirings, and thinning in order to satisfy high-density fine wiring. Further, lead free solder has been used progressively in the relevant field with the aim of decreasing environmental burdens. Under such situations, wiring members such as FFC (flexible flat cable), TAB (tape automated bonding) tape, FPC (flexible printed circuit) and MFJ (multi frame joiner) are required to have improved heat resistance. An insulating layer for the above-mentioned wiring members are basically composed of a base film and an adhesive layer. Such a wiring member is described, for example, in Japanese Patent Laid-Open No. Hei 05-29399 (Patent Document 1), in which the base film used therein is, for example, an organic insulating film composed of a heat resistant film such as polyimide, polyether imide, polyphenylene sulfide or polyether ether ketone, or a composite heat resistant film such as epoxy resin-glass cloth or epoxy resin-polyimide-glass cloth. Patent Document 1 discloses use of a thermosetting adhesive composition containing a polyamide resin and an epoxy resin as the adhesive layer.

However, the thermosetting adhesive composition described in Patent Document 1 has a problem in storage stability of the heat resistant adhesive film due to high reactivity between the amino group present in the polyamide resin structure and the epoxy resin. For overcoming this problem, Japanese Patent Laid-Open No. 2004-136631 (Patent Document 2) proposes use of a thermosetting adhesive composition composed of a phenoxy resin having at both ends thereof an epoxy group, an acrylic rubber, and a curing agent for an adhesive layer. As the phenoxy resin, a bisphenol A type, a bisphenol F type, a bisphenol AD type, a bisphenol S type, and a copolymer type having bisphenol A and bisphenol F are exemplified. Although the heat resistant adhesive film of Patent Document 2 contains a phenoxy resin known to be relatively excellent in adhesive force in the adhesive layer thereof, it has still problems in adhesive force as low as about 0.5 kN/m and solder heat resistance of 260° C. which is not sufficient.

Japanese Patent Laid-Open No. 2010-150437 (Patent Document 3) discloses use of a thermosetting adhesive composition having a thermoplastic polyurethane resin having a weight-average molecular weight of from 80,000 to 800,000, an epoxy resin, and an epoxy resin curing agent for an adhesive layer, in order to overcome the above-mentioned problems. Although a heat resistant adhesive film using a typical polyurethane resin has a problem in storage stability due to high reactivity between the polyurethane resin and an epoxy resin, Patent Document 3 describes that a heat resistant adhesive film has improved storage stability by using a polyurethane resin having a molecular weight within a predetermined range. The resulting heat-resistant film has adhesive force of 1.1 to 1.7 kN/m. Further, Japanese Patent Laid-Open No. 2010-143988 (Patent Document 4) discloses that a heat resistant adhesive film using a thermosetting adhesive composition having a polyurethane resin, an epoxy resin, and a novolac resin of a specific structure for the adhesive layer thereof has a solder heat resistance of 300° C.

Japanese Patent Laid-Open No. 2009-67934 (Patent Document 5) discloses use of a thermosetting adhesive composition containing a sulfone-containing polyhydroxy polyether resin and maleimide for an adhesive layer on a self-fusing enamel wire.

SUMMARY OF THE INVENTION

The present invention is basically composed of a thermosetting adhesive composition having a phenoxy resin containing a bisphenol S skeleton and bismaleimide in the structure thereof, in which 3 vol % to 20 vol % of an inorganic needle-like filler have been dispersed in the thermosetting adhesive composition and the inorganic needle-like filler has a diameter of from 0.1 μm to 10 μm, has a length of from 5 μm to 300 μm, and has an aspect ratio of from 10 to 60; a heat resistant adhesive film including the adhesive layer formed of the thermosetting adhesive composition; and a wiring film including the heat resistant adhesive film and a conductor wiring.

The present invention can provide a heat resistant adhesive film excellent in storage stability at room temperature, low-temperature heat resistance and wiring burying property, and hard to curl; a wiring film such as FFC excellent in solder heat resistance, moisture resistance reliability and long-term heat-resistance reliability, obtained by using the heat resistant adhesive film; and a thermosetting adhesive composition capable of realizing these films.

DETAILED DESCRIPTION OF THE PREFERRED EMBODIMENTS

Figure 1A:
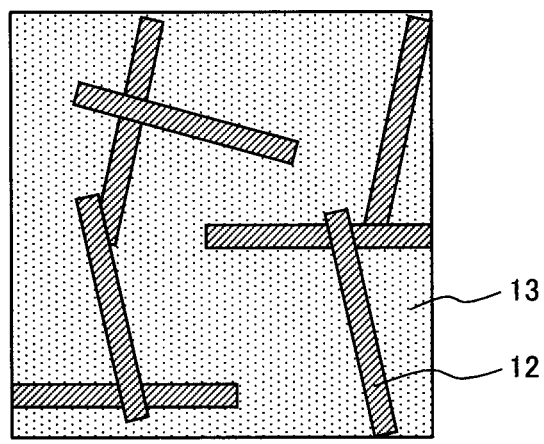
FIG. 1A is a plan view showing a first example of an arrangement of inorganic needle-like fillers in an adhesive composition of the present invention.

It is known that polyurethane resins used in Patent Documents 3 and 4 usually undergo depolymerization at a temperature of 200° C. or greater. In addition, it is known that polyurethane has long-term heat resistance reliability of 80 to 100° C. Heat resistant adhesive films using a thermosetting adhesive composition containing a polyurethane resin for the adhesive layer of the thermosetting adhesive composition cannot be used freely in the field of electronic equipment for industry and automobile electronic devices that require long-term heat-resistance reliability. Further, the mechanism of suppressing the reaction with the epoxy resin by regulating the molecular weight of the polyurethane resin as described in Patent Document 3 is based on decrease in the concentration of functional groups and the reactivity itself is not changed so that no sufficient consideration has been given to the storage stability of the heat resistant adhesive film. For a heat resistant adhesive film using a thermosetting adhesive composition, storage at low temperatures not greater than 5° C. is usually recommended. Dew condensation water is sometimes produced on a surface of the heat resistant adhesive films taken out from a low-temperature refrigerator and it is likely to cause adhesion failure or deterioration in solder heat resistance. The heat resistant adhesive films should therefore be stored at room temperature.

The sulfone-containing polyhydroxy polyether resin described in Patent Document 5 is different from a phenoxy resin having a bisphenol S skeleton to be used in the present invention. The problem of the thermosetting adhesive composition described in Patent Document 5 is that a high boiling point solvent such as cyclohexanone is used for the preparation of a varnish from the composition. When a heat resistant adhesive film is prepared by using the thermosetting adhesive composition, remaining of the high boiling point solvent may cause deterioration in solder heat resistance. Moreover, when the heat resistant adhesive film is dried sufficiently at higher temperature, its adhesive layer is cured further, which may curl the film or deteriorate the wiring burying property. In addition, since fusion bonding or curing temperature of the thermosetting adhesive composition described in Patent Document 5 is as high as 220° C. or greater but less than 240° C., manufacturing equipment suited for a high-temperature process of 220° C. or greater is necessary. The processing temperature during formation of a wiring film should be designed to fall within a range from 100° C. to 180° C. in order to reduce the running cost.

An object of the present invention is to provide a heat resistant adhesive film which is excellent in storage stability at room temperature, low-temperature adhesion properties, and wiring burying property and is hard to curl; a wiring film such as FFC excellent in solder heat resistance and long-term heat-resistance reliability and obtained using the heat resistant adhesive film; and a thermosetting adhesive composition capable of realizing these films.

The inorganic needle-like fillers have been dispersed in the thermosetting adhesive composition and they have been bonded to each other via a resin component. For example, in a heat resistant adhesive film obtained by using the thermosetting adhesive composition of the present invention to form an adhesive layer on a polyimide film, the inorganic needle-like fillers have been bonded to each other via a resin component so that the adhesive layer has increased rigidity and curl which will otherwise occur in a heat resistant adhesive film can be suppressed effectively. The inorganic needle-like fillers are preferably dispersed without being directly restrained from each other as fibers do in a woven cloth or nonwoven cloth or without being entangled excessively. Direct entanglement or restraint between inorganic needle-like fillers may deteriorate the melt fluidity of the thermosetting adhesive composition, thereby deteriorating the adhesion properties or wiring burying property. In order to keep a preferred dispersed state, it is preferred to add the inorganic needle-like fillers in an amount of from 3 vol % to 20 vol % based on the thermosetting adhesive composition.

The above-described "diameter" means a diameter in the short-axis direction which is perpendicular to the long-axis of the inorganic needle-like filler. The fillers may each have a circular, oval, rectangular, polygonal, or amorphous cross-section, but preferably a circular, oval, rectangular, or polygonal cross-section. An almost completely flat shape is not preferred so much, because a filler having such a shape has low bending strength in a direction orthogonal to the flat plane and there is a possibility of the filler failing to effectively suppress the heat resistant adhesive film from curling.

Figure 1B:
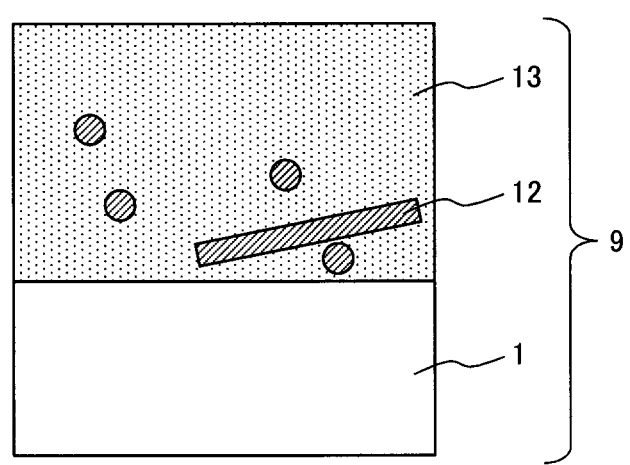
FIG. 1B is a cross-sectional view showing the first example of the arrangement of the inorganic needle-like fillers in the adhesive composition of the present invention.

FIG. 1A is a plan view showing a first example of an arrangement of inorganic needle-like fillers in an adhesive composition of the present invention. FIG. 1B is a cross-sectional view showing the first example of the arrangement of the inorganic needle-like fillers in the adhesive composition of the present invention.

Figure 2A:
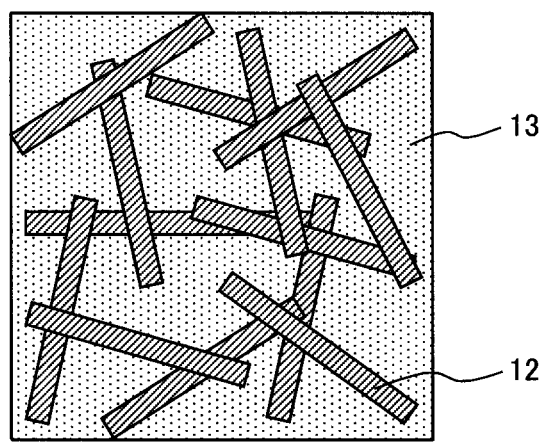
FIG. 2A is a plan view showing another example of the arrangement of the inorganic needle-like fillers in the adhesive composition of the present invention.
Figure 2B:
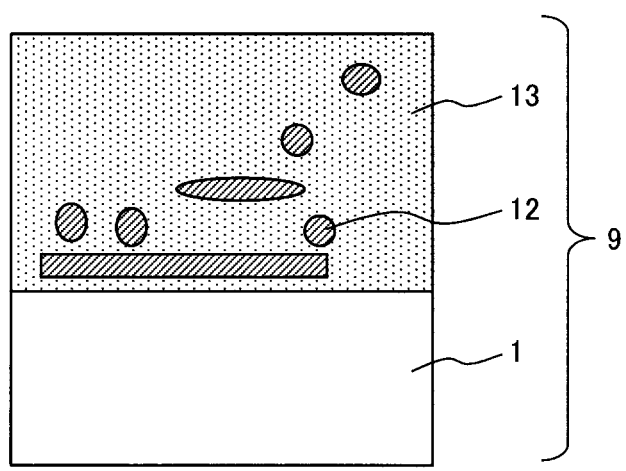
FIG. 2B is a cross-sectional view showing the other example of the arrangement of the inorganic needle-like fillers in the adhesive composition of the present invention.

FIG. 2A is a plan view showing another example of the arrangement of the inorganic needle-like fillers in the adhesive composition of the present invention. FIG. 2B is a cross-sectional view showing the other example of the arrangement of the inorganic needle-like fillers in the adhesive composition of the present invention.

In the present invention, inorganic needle-like fillers 12 are preferably bonded to each other via a resin component 13 without being directly entangled with each other or restrained from each other as fibers do in a woven fabric or a nonwoven fabric. The inorganic needle-like fillers 12 are partially brought into contact with each other in the adhesive layer to enhance the rigidity of the adhesive layer as shown in FIG. 1A. As shown in the schematic view of FIG. 1B, the inorganic needle-like fillers 12 are preferably arranged in almost parallel to the base film 1.

More preferably, as shown in the schematic view of FIGS. 2A and 2B, two or more inorganic needle-like fillers overlap with each other in the adhesive layer 13 to constitute a steric arrangement. When the inorganic needle-like fillers 12 are sterically arranged in the adhesive layer, the adhesive layer has further enhanced rigidity, which effectively suppresses the heat resistant adhesive film 9 from curling.

Although no particular limitation is imposed on the overlapping manner of the inorganic needle-like fillers, inorganic needle-like fillers lying at an angle of 30 degrees or less relative to the bottom surface of the adhesive layer is preferred because they form a beam-like structure and effectively suppress the curling of the heat resistant adhesive film which may otherwise occur by drying during formation of the heat-resistant adhesive film. The inorganic needle-like fillers thus bonded via the resin component 13 are each released from the bonding when the thermosetting adhesive composition is melted so that they do not interfere with the melt flow of the adhesive layer 2. As a result, the heat resistant adhesive film can be effectively suppressed from curling while suppressing deterioration of the wiring burying property of the heat resistant adhesive film.

In a preferred embodiment of the present invention, there are provided a thermosetting adhesive composition containing 100 parts by weight of a phenoxy resin containing a bisphenol S-skeleton in the structure thereof and 5 parts by weight to 30 parts by weight of a maleimide compound containing a plurality of maleimide groups in the structure thereof; and further containing 3 vol % to 20 vol % of an inorganic needle-like filler; and a heat resistant adhesive film and a wiring film using the composition.

In developing a thermosetting adhesive composition excellent in storage stability at room temperature and excellent in adhesion, heat resistance after curing, and long-term heat resistance reliability, the present inventors selected a phenoxy resin having a 5% thermal weight loss temperature exceeding 350° C. as a base resin. Further, they decided to use a polyimide film excellent in the heat resistance as the base film of the heat resistant adhesive film. It was necessary to select an appropriate solvent for preparing a thermosetting adhesive composition by using a phenoxy resin, applying the resulting composition onto the polyimide film, and drying to form an adhesive layer. A good solvent for the phenoxy resin is, for example, tetrahydrofuran (THF) or cyclohexanone. The inventors however considered that cyclohexane was preferred in consideration that THF had a high risk of explosion during the preparation.

As a result of various investigations, the present inventors have found that a thermosetting adhesive composition containing a phenoxy resin containing a phenoxy resin having a bisphenol S skeleton and a maleimide compound having a plurality of maleimide groups has high adhesion properties to a polyimide film or a conductor wiring and has sufficiently high heat resistance and moisture resistance reliability at the adhesion interface. Even if the composition is dried at 180° C. which is lower than the conventional drying temperature, the curing reaction of the adhesive layer proceeds, which causes strong curling of the heat resistant adhesive film and considerably deteriorates the handling property. The present inventors have found that a thermosetting adhesive composition containing predetermined inorganic needle-like fillers can effectively suppress the heat resistant adhesive film from curling; the composition containing even inorganic needle-like fillers can maintain high adhesion properties; and the composition has an improved wiring burying property by using a plasticizer in combination, completing the present invention.

The function of the inorganic needle-like fillers in the present invention will be described further.

As described above, the adhesive layer of the heat resistant adhesive film according to the present invention can keep its adhesion properties even after the drying step of 180° C. The heat applied during the drying step, however, makes apparent a difference in thermal expansion between the polyimide film and the adhesive layer or strongly curls the heat resistant adhesive film. The curling of the film should be suppressed because it makes it difficult to transport the heat resistant adhesive film or place it at a predetermined position. It is usually effective to add low thermal expansion inorganic fillers in order to suppress thermal expansion or curing shrinkage of resin materials.

The curling of the heat resistant adhesive film cannot be suppressed sufficiently only by filling the adhesive layer with general-purpose crushed fillers or spherical fillers. Addition of excessive inorganic needle-like fillers suppressed curling, but significantly deteriorated adhesion properties. As a method of controlling the shape and arrangement of the inorganic needle-like fillers to suppress a filling amount of inorganic needle-like fillers and suppressing curling while keeping adhesion properties or a wiring burying property, the present inventors have thought out introduction of a pseudo frame structure into the adhesive layer by using the inorganic needle-like fillers.

Examples of it are schematically shown in FIGS. 1A and 1B and FIGS. 2A and 2B.

The term "pseudo frame structure" as used herein means a structure in which two or more inorganic needle-like fillers present in the adhesive layer have overlapped with each other to form a steric structure and at the same time, these inorganic needle-like fillers have been bonded to each other by a resin component in the thermosetting adhesive composition.

The inorganic needle-like fillers dispersed in the adhesive layer are firmly bonded to each other at normal temperature by the resin component forming the adhesive layer. This makes it possible to increase the flexural modulus of the system to suppress the heat resistant adhesive film from curling while reducing the amount of the inorganic needle-like fillers. The introduction of the pseudo frame structure is effective for reducing the amount of the inorganic needle-like fillers, thereby achieving high melt fluidity and high adhesion properties, because the resin component is melted at the time of adhesion and the inorganic fillers are released from the frame structure.

As a result of investigation on the shape and amount of inorganic needle-like fillers permitting introduction of the autonomously preferable pseudo frame structure during the formation of the adhesive layer, it has been confirmed that when inorganic needle-like fillers having a diameter of from 0.1 μm to 10 μm, a length of from 5 μm to 300 μm, and an aspect ratio of from 10 to 60 are incorporated in an amount of from 3 vol % to 20 vol % in the thermosetting adhesive composition, the pseudo frame structure in which the inorganic needle-like fillers have been overlapped and bonded firmly to each other is formed at the time of applying the thermosetting adhesive composition onto a polyimide film and drying, resulting in effective suppression of the heat resistant adhesive film from curling. It has been found further that the inorganic needle-like fillers have preferably a diameter of 1 μm or less and an aspect ratio of from 10 to 60 in order to improve the dispersibility of the inorganic needle-like fillers and suppress heterogeneous dispersion in the plane of the adhesive layer.

The following are examples of the mode for carrying out the present invention:

(1) A thermosetting adhesive composition contains inorganic needle-like fillers in dispersed form in an amount of from 3 vol % to 20 vol %, the inorganic needle-like fillers having a diameter of from 0.1 μm to 10 μm, a length of from 5 μm to 300 μm, and an aspect ratio of from 10 to 60. The thermosetting adhesive composition of the present invention is suited for a curling-reduced heat resistant adhesive film from the standpoints of the shape, amount, and arrangement structure of the inorganic needle-like fillers.

(2) A thermosetting adhesive composition contains 100 parts by weight of a phenoxy resin having a bisphenol S skeleton in the structure thereof and 10 parts by weight to 30 parts by weight of a maleimide compound having a plurality of maleimide groups in the structure thereof.

(3) The phenoxy resin containing the bisphenol S skeleton has preferably the structure represented by the following Formula (1):

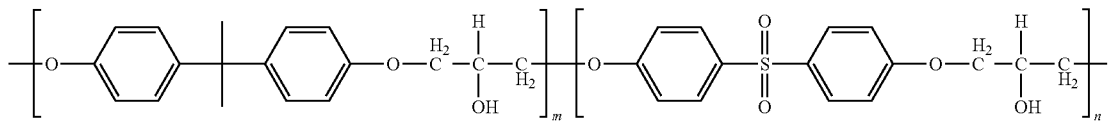

Formula (1)

The phenoxy resin has preferably a bisphenol A skeleton and a bisphenol S skeleton. In the above-mentioned structural formula, m and n each stand for an integer and an n/m molar ratio falls preferably within a range of from 3/7 to 5/5. In addition, the phenoxy resin having a polystyrene-equivalent weight-average molecular weight falling within a range of from 20000 to 60000 is preferred.

(4) As the inorganic needle-like fillers, those subjected to adhesion enhancing treatment to the resin component of the thermosetting adhesive composition are preferred. Examples of this treatment include coupling treatment with various coupling agents and hydrophilization treatment for forming a hydroxyl group or carboxyl group on the surface of the inorganic needle-like fillers. In the coupling treatment, a coupling agent may be held in advance on the surface of the inorganic needle-like fillers or a coupling agent may be added to the thermosetting adhesive composition. From the standpoint of workability, addition of the coupling agent to the thermosetting adhesive composition is simple and easy and is therefore preferred. The amount of it falls within a range of preferably from 0.01 part by weight to 5 parts by weight based on 100 parts by weight of the phenoxy resin. As the coupling agent, amine-based, vinyl-based, and isocyanate-based silane coupling agents capable of forming a covalent bond with the maleimide compound or phenoxy resin are preferred.

(5) A maleimide compound having a melting temperature of 168° C. or less and a gelling time at 200° C. of from 120 seconds to 350 seconds or/and a maleimide compound having a melting temperature of 168° C. or less and a gelling time at 250° C. of from 160 seconds to 150 seconds are particularly preferred.

The maleimide compound is preferably a maleimide compound represented by the following formula (2), (3) or (4) and at least one of them is used.

Formula (2)

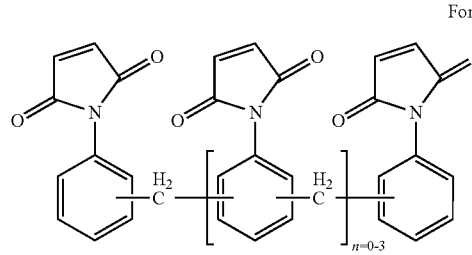

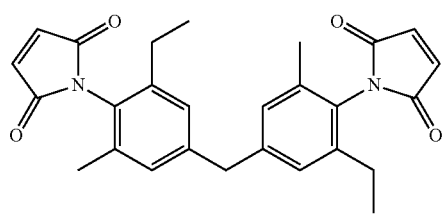

Formula (3)

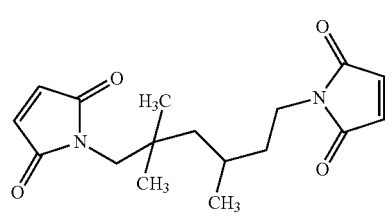

Formula (4)

In the formula (2), n=0-3 means that at least one of the compounds in which n stands for from 0 to 3 is contained.

(6) In the present invention, the thermosetting adhesive composition preferably contains a plasticizer further. The plasticizer is used in an amount of preferably from 1 part by weight to 30 parts by weight based on 100 parts by weight of the phenoxy resin component. As the plasticizer, a reactive plasticizer having crosslinkability or polymerizability by itself is preferred. Moreover, from the standpoint of improving the melt fluidity of the adhesive layer after drying, using a plasticizer having a reaction mechanism different from that of the maleimide compound and causing its own polymerization or crosslink reaction is preferably used in combination with a polymerization initiator thereof. The polymerization starting temperature of the polymerization initiator of the present reactive plasticizer is preferably 160° C. or greater, more preferably 180° C. or greater but less than 220° C. from the standpoint of suppressing curing of the adhesive layer during high-temperature drying and acceleration of polymerization or crosslink reaction in post curing.

(7) The present invention provides a heat resistant adhesive film obtained by placing the above-mentioned thermosetting adhesive composition on a polyimide film. More specifically, provided is a heat resistant adhesive film having, as the adhesive layer thereof, a thermosetting adhesive composition having 100 parts by weight of a phenoxy resin containing a bisphenol S skeleton in the structure thereof and from 5 parts by weight to 30 parts by weight of a maleimide compound containing a plurality of maleimide groups in the structure thereof; and further having from 3 vol % to 20 vol % of inorganic needle-like fillers.

Figure 3:
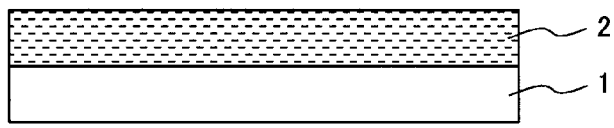
FIG. 3 is a schematic cross-sectional view of a first heat resistant adhesive film according to the present invention.
Figure 4:
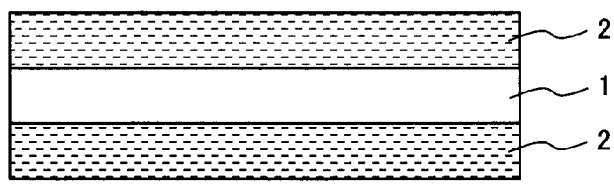
FIG. 4 is a schematic cross-sectional view of a second heat resistant adhesive film according to the present invention.

The heat resistant adhesive film of the present invention may be provided as either a one-side heat resistant adhesive film having an adhesive layer 2 on one side of a polyimide film 1 as shown in FIG. 3 or a both-side heat resistant adhesive film having an adhesive layer 2 on both sides of a polyimide film as shown in FIG. 4. The thickness of the adhesive layer and the polyimide film can be selected freely, depending on the intended use, but it is preferred to roughly select the thickness of the adhesive layer within a range of from 10 to 100 μm and the thickness of the polyimide film within a range of from 25 μm to 100 μm from the standpoints of productivity and handling property of the heat resistant film or wiring film.

(8) By using the maleimide compound, a curing reaction of the adhesive layer during high-temperature drying can be suppressed. This enhances melt fluidity of the adhesive layer upon adhesion and improves the wiring burying property.

(9) In the heat resistant adhesive film of the present invention, the adhesive layer preferably contains a plasticizer further. As the plasticizer, a reactive plasticizer having crosslinkability or polymerizability by itself is preferred. Moreover, it is preferred to use a plasticizer having a reaction mechanism different from that of the maleimide compound and causing its own polymerization or crosslink reaction in combination with a polymerization initiator thereof from the standpoint of improving the fluidity of the adhesive layer after drying. The initiation temperature of the polymerization initiator of the present reactive plasticizer is preferably 160° C. or greater, more preferably 180° C. or greater but less than 220° C. from the standpoint of suppressing curing of the adhesive layer during high-temperature drying and acceleration of the polymerization or crosslink reaction in curing.

(10) According to the present invention, a laminated film having a conductor layer can be obtained by fusion bonding of the heat resistant adhesive film and a conductor foil. More specifically, a laminated film can be obtained by fusion bonding of a conductor foil and a heat resistant adhesive film having a thermosetting adhesive composition including 100 parts by weight of a phenoxy resin containing a bisphenol S skeleton in the structure thereof and from 5 parts by weight to 30 parts by weight of a maleimide compound containing a plurality of maleimide groups in the structure thereof, and further having inorganic needle-like fillers in an amount ranging from 3 vol % to 20 vol % as an adhesive layer thereof on a polyimide film.

Figure 5:
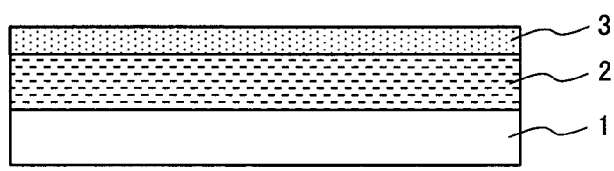
FIG. 5 is a schematic cross-sectional view of a first laminated film according to the present invention formed using the heat resistant adhesive film shown in FIG. 3.
Figure 6:
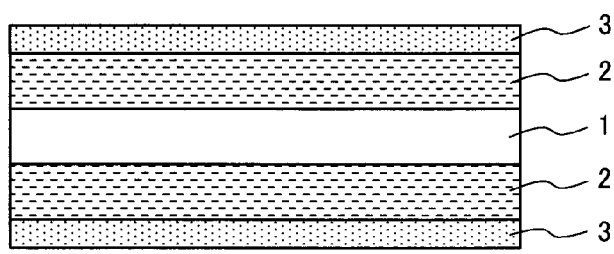
FIG. 6 is a c schematic cross-sectional view of a second laminated film according to the present invention formed using the heat resistant adhesive film shown in FIG. 4.

The adhesive layer of the laminated film is preferably in B-stage form, and is more preferably in a cured form. The adhesive layer in such a form can have improved adhesive force with the conductor foil. In the laminated film of the present invention, a conductor layer 3 can be formed on one side or on both sides of the heat resistant adhesive film as shown in FIGS. 5 and 6. Although the thickness of each layer of the laminated film may be adjusted arbitrarily, the thickness of the conductor layer is adjusted to preferably from 9 μm to 35 μm from the standpoint of keeping wiring processing accuracy in etching.

(11) By using the above-mentioned specific maleimide compound, a curing reaction of the adhesive layer during high-temperature drying can be suppressed. Moreover, the adhesive layer can have improved adhesive force with the conductor layer in the B-stage form.

(12) The present invention provides a wiring film by subjecting the conductor layer on the laminated film to wiring processing. More specifically, the present invention provides a wiring film including a polyimide film; a thermosetting adhesive composition as an adhesive layer on the polyimide film, the composition having 100 parts by weight of a phenoxy resin containing a bisphenol S skeleton in the structure thereof and from 5 parts by weight to 30 parts by weight of a maleimide compound containing a plurality of maleimide groups in the structure thereof and further having from 3 vol % to 20 vol % of inorganic needle-like fillers; and a conductor wiring on the adhesive layer. The adhesive layer of the present wiring film is preferably in the B-stage form, and is more preferably in a cured form by post curing or the like. This enables enhancement of the adhesive force between the adhesive layer and the conductor wiring.

Figure 7:
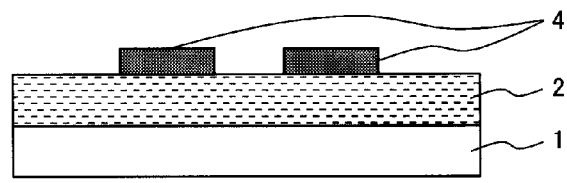
FIG. 7 is a schematic cross-sectional view of a first wiring film according to the present invention.
Figure 8:
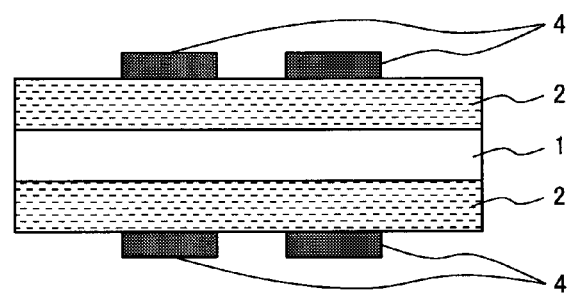
FIG. 8 is a schematic cross-sectional view of a second wiring film according to the present invention.
Figure 9:
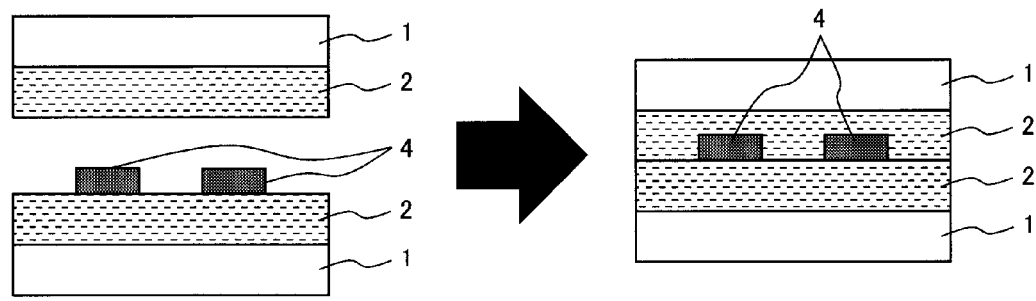
FIG. 9 is an explanatory view of a process for forming a third wiring film according to the present invention from the heat resistant adhesive film shown in FIG. 3 and the wiring film shown in FIG. 7.
Figure 10:
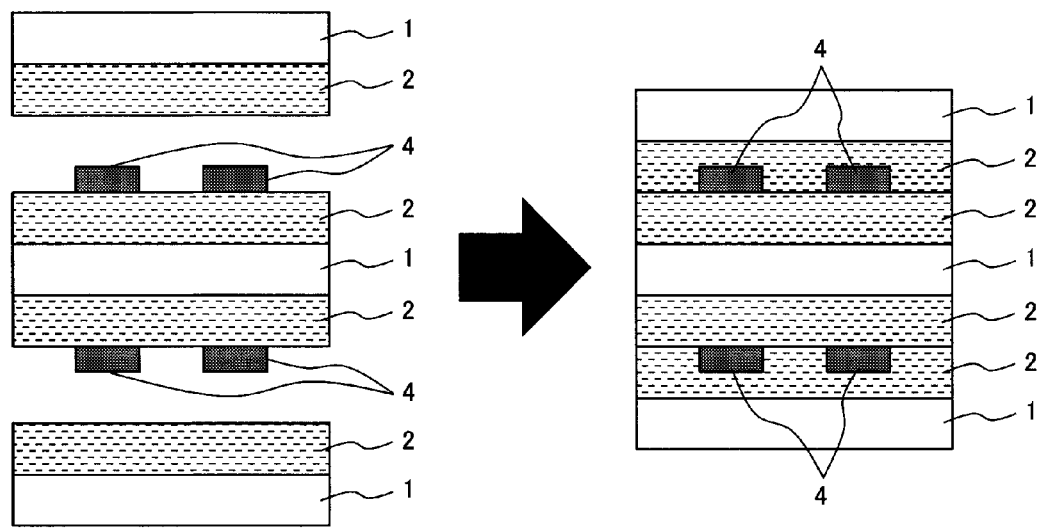
FIG. 10 is an explanatory view of a process for forming a fourth wiring film according to the present invention from the heat resistant adhesive film shown in FIG. 3 and the wiring film shown in FIG. 8.
Figure 11:
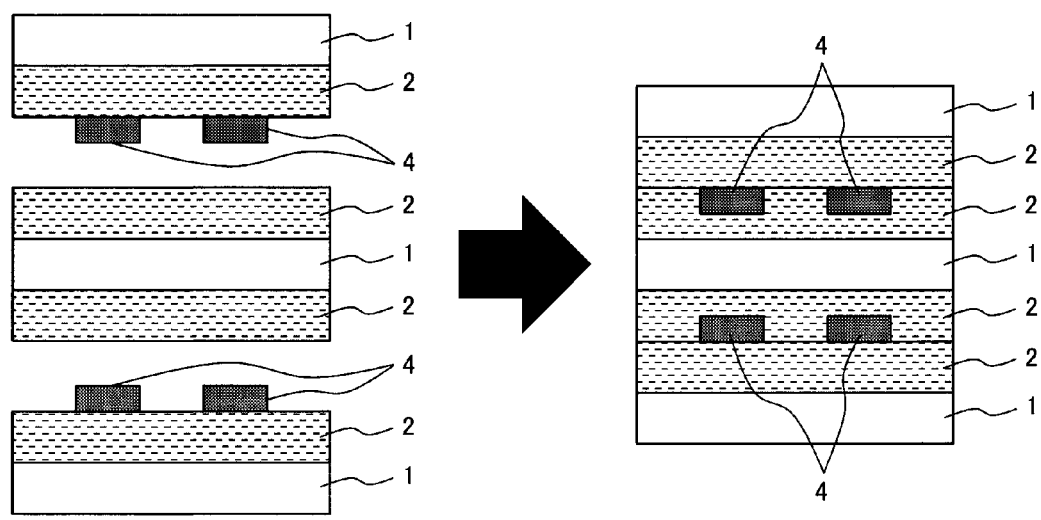
FIG. 11 is an explanatory view of a process for forming a fifth wiring film according to the present invention from the heat resistant adhesive film shown in FIG. 4 and the wiring film shown in FIG. 7.
Figure 12:
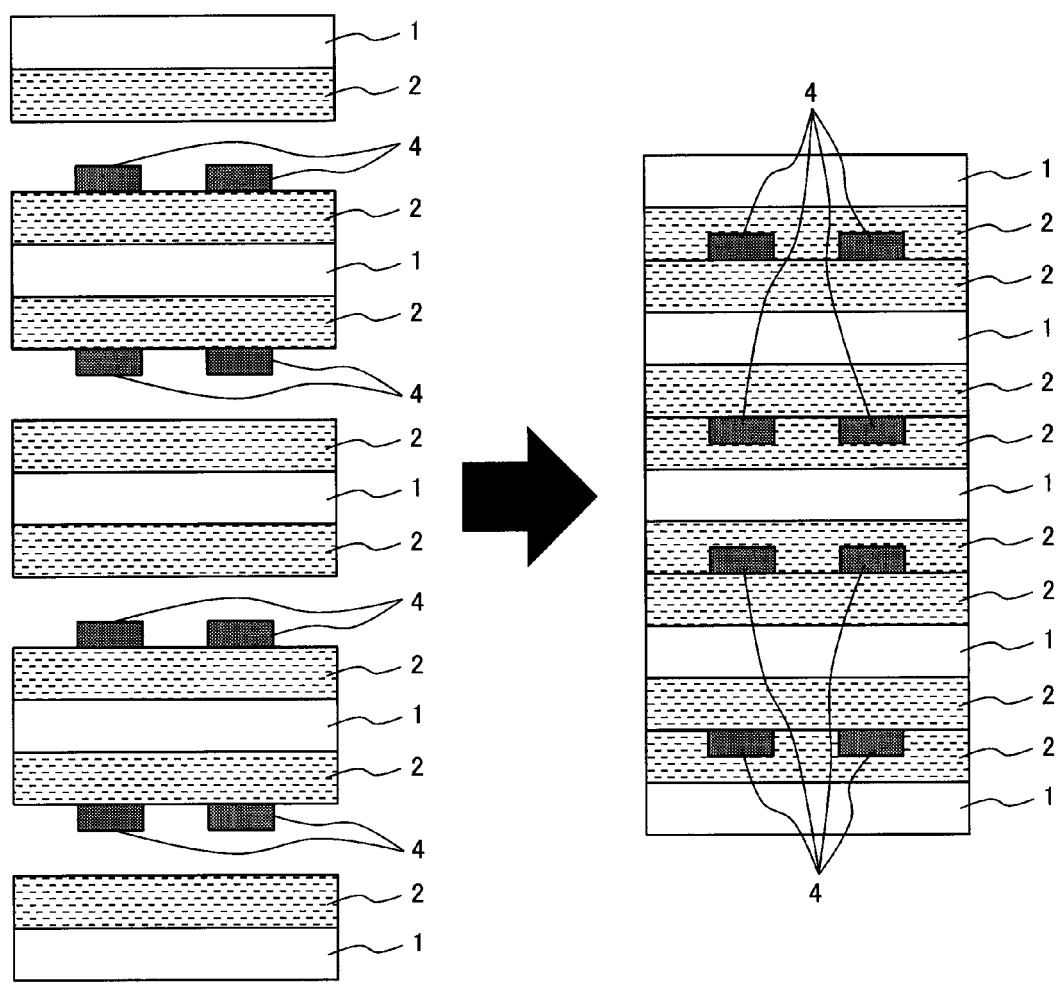
FIG. 12 is an explanatory view of a process for forming a sixth wiring film according to the present invention from the heat resistant adhesive film shown in FIG. 3, the heat resistant adhesive film shown in FIG. 4, and the wiring film shown in FIG. 8.

The wiring film of the present invention can be formed by etching the laminated film as shown in FIG. 5 or 6 to form a conductor wiring on one side or both sides as shown in FIG. 7 or 8. Moreover, the conductor wiring present as an outer layer can be coated with the heat resistant adhesive film of the present invention as shown in FIGS. 9 to 11. This enables protection of the conductor wiring. Moreover, in the present invention, a multilayer wiring can be formed from a plurality of wiring films as shown in FIG. 12.

Figure 13:
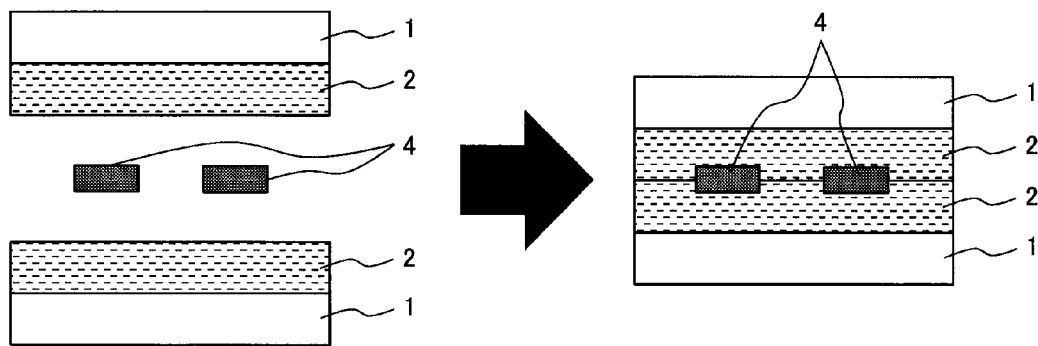
FIG. 13 is an explanatory view of a process for forming a seventh wiring film according to the present invention from the heat resistant adhesive film shown in FIG. 3 and a conductor wiring.

In the present invention, wiring film can be formed by placing two one-side heat resistant adhesive films so that their adhesive layers face with each other, inserting a conductor wiring between them, and fusion bonding the one-side heat resistant adhesive films and the conductor wiring, as shown in FIG. 13. Further, a multilayer wiring film can be formed by placing two one-side heat resistant adhesive films so that their adhesive layers face with both surfaces of a both-side heat resistant adhesive film, respectively, inserting a conductor wiring 4 between each of the one-side adhesive films and the both-side adhesive film, and fusion bonding the both-side heat resistant adhesive film, the conductor wirings, and the one-side heat-resistant films, as shown in FIG. 14.

Figure 14:
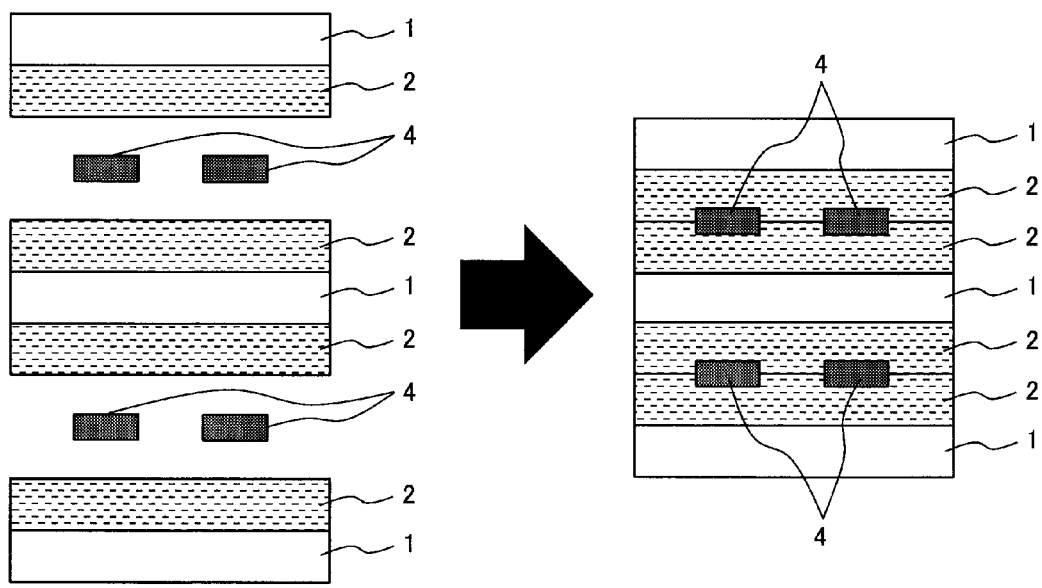
FIG. 14 is a schematic cross-sectional view of a process for forming an eighth wiring film according to the present invention from the heat resistant adhesive film shown in FIG. 3, the heat resistant adhesive film shown in FIG. 4, and the conductor wiring.

For the formation of the wiring film as shown in FIG. 13 or 14, it is preferred to use a conductor wiring having a thickness of 35 μm or greater in order to ensure the handling ease of the conductor wiring 4 when the conductor wiring 4 is placed on the heat resistant adhesive film. No particular limitation is imposed on the thickness of the conductor wiring, but the thickness of the conductor wiring is preferably 100 μm or less when the thickness of the adhesive layer of the heat resistant adhesive film is 50 μM or less. The conductor wiring does not need etching processing so that the present wiring film can be formed at high productivity.

(13) The above-mentioned wiring film has preferably a plurality of conductor wirings within the same plane. This can increase the density of conductor wirings.

(14) In the above-mentioned wiring film, the adhesive layer is post-heated at the fusion bonding temperature or greater in order to increase the adhesive force between the conductor wiring and the heat resistant adhesive film. In the present invention, the fusion bonding temperature is preferably 160° C. or less and the fusion bonding pressure is preferably 3 MPa or less, more preferably 1 MPa or less from the standpoint of productivity. Moreover, the post-curing temperature is preferably 180° C. or greater but less than 220° C. The post curing may be conducted while applying pressure to the wiring film or may be conducted without applying pressure.

(15) In the wiring film, the conductor wiring is preferably a copper wiring from the standpoint of high conductivity.

(16) In the wiring film, oxidation of the copper wiring is suppressed and the adhesion is improved by coating at least a portion of the outer layer of the copper wiring with a metal layer containing any of tin, nickel, zinc or cobalt, or/and an oxide layer or/and a hydroxide layer of the metal.

(17) Moreover, in the above-mentioned wiring film, at least a portion of the outer layer of the conductor wiring may be coated with a silane coupling agent containing at least one group selected from the class consisting of amino groups, vinyl groups, styryl groups, acrylate groups, and methacrylate groups. The adhesion reliability between the conductor wiring and the adhesive layer can be improved by this coating.

Next, the main function of each of the phenoxy resin, maleimide compound, inorganic needle-like fillers, and plasticizer in the present invention will next be described.

The phenoxy resin is a component mainly having a function of providing the thermosetting adhesive composition with a film forming property and providing the adhesive layer with flexibility and mechanical strength after curing. As a preferred range of the molecular weight for developing such a function, a weight average molecular weight as measured by gel permeation chromatography (GPC) (a polystyrene standard) is from 20000 to 60000.

The content of the bisphenol S skeleton based on the total amount of the bisphenol S skeleton and other skeleton constituents, for example, a bisphenol A skeleton is preferably from 30 mol % to 50 mol % (in other words, the n/m molar ratio in the formula (1) is from 3/7 to 5/5). Examples of such a phenoxy resin include "YX8100" (trade name; product of Japan Epoxy Resin), "YPS-007A30" (trade name; product of Toto Kasei), and "YP-50" (trade name; product of Nippon Steel Chemical).

The maleimide compound is a component for providing the adhesive layer with melt fluidity and thermosetting properties. This improves the fusion bonding property of the adhesive layer and also improves the solder heat resistance, moisture resistance, and chemical resistance of the adhesive layer after curing. Further, it is preferred to select a maleimide compound having a melting temperature of 160° C. or less and a gelling time at 200° C. of from 180 seconds to 350 seconds or/and a maleimide compound having a melting temperature of 160° C. or less and a gelling time at 250° C. of from 110 seconds to 150 seconds in order to simultaneously satisfy the fusion bonding properties and adhesion properties at low temperatures of 160° C. or less, the solder heat resistance, and moisture resistance.

Specific preferred examples of the maleimide compound include "BMI-1000", "BMI-2000", "BMI-5000", "BMI-5100", and "BMI-TMH" (each, trade name; product of Daiwa Kasei Industry).

With regard to a preferred mixing ratio of the phenoxy resin and the maleimide compound in the present invention, the maleimide compound is added in an amount ranging from 5 parts by weight to 30 parts by weight based on 100 parts by weight of the phenoxy resin. Amounts of the maleimide compound less than 5 parts by weight may lead to insufficient curing, which sometimes deteriorates the heat resistance, moisture resistance, chemical resistance, and adhesion properties. On the other hand, amounts of the maleimide compound exceeding 30 parts by weight may sometimes lead to problems such as deterioration in adhesion properties and formation of a non-uniform adhesive layer due to deposition of the maleimide compound.

Examples of the inorganic needle-like filler include aluminum borate whisker, potassium titanate whisker, zinc oxide whisker, magnesium sulfate whisker, wollastonite whisker, calcium carbonate whisker, rock wool, and various glass chopped strands. Specific examples of commercially available products of them include "ALBOREX Y" (trade name; product of Shikoku Chemicals; diameter: from 0.5 μm to 1 μm, fiber length: from 10 μm to 30 μm) as the aluminum borate whisker; "TISMO N" (trade name; product of Otsuka Chemical; diameter: from 0.3 μm to 0.6 μm, fiber length: from 10 μm to 20 μm) as the potassium titanate whisker; zinc oxide whisker (product of Panasonic; diameter: from 0.2 μm to 3 μm; fiber length: from 2 μm to 50 μm) as the zinc oxide whisker; "MOS-HIGE" (trade name; product of Ube Industries; diameter: 0.5 μm, fiber length: from 10 μm to 30 μm) as the magnesium sulfate whisker; "NYAD 1250" and "NYAD-G" (each, trade name; product of NYCO Minerals; diameter; from 3 μm to 40 μm, fiber length: from 9 μm to 600 μm) as the wollastonite whisker; "WHISCAL A" (trade name; product of Maruo Calcium; diameter: from 0.5 μm to 1.0 μm, fiber length: from 20 μm to 30 μm) as the calcium carbonate whisker; "LAPINUS ROCKFIL RF4103" (trade name; product of Lapinus Fibers; diameter: from 5 μm to 10 μm, fiber length: from 20 μm to 170 μm) as the rock wool; and "ECS03-615" (trade name product of Central Glass; diameter: 9 μm, fiber length: 3000 μm) as the chopped strands. Too long fibers may be ground for use as needed.

The mixing ratio of the inorganic needle-like fillers in the present invention is preferably in a range of from 3 vol % to 20 vol % in the adhesive composition. Ratios of the inorganic needle-like fillers less than 3 vol % deteriorate the curling suppressive effect, while those exceeding 20 vol % deteriorate the adhesive force between the polyimide film and the conductor wiring and the wiring burying property.

The plasticizer is a component for increasing the melt fluidity of the adhesive layer after drying and improving the wiring burying property of the wiring films shown in FIGS. 9 to 14. As the plasticizer, various compounds having a melting property and nonvolatility at the fusion bonding temperature between the conductor wiring or conductor layer and the heat resistant adhesive film can be used. Specific examples include resorcinol bis(diphenyl phosphate), 1,3-phenylene bis(dixylenyl phosphate), and bisphenol A bis(diphenyl phosphate).

Further, as the plasticizer, compounds having polymerizability or crosslinkability are preferred from the standpoint of improving solder heat resistance and moisture resistance. Examples of such compounds include radical polymerizable monomers having crosslinkability such as triallyl isocyanurate, 2,2-bis[4-(methacryloxyethoxy)phenyl]propane, tricyclodecane dimethanol dimethacrylate, and 1,2-bis(vinylphenyl)ethane, various epoxy resins such as bisphenol A and bisphenol F, and oxetane resins such as bis((1-ethyl (3-oxetanyl))methyl)ether ("ARON OXETANE OXT-221", trade name; product of Toagosei). In particular, it is preferred to use the epoxy resin or oxetane resin different in reaction mechanism from the maleimide compound as the plasticizer in order to suppress a curing reaction of the adhesive layer during drying. Of such epoxy resins and oxetane resins, a monofunctional monomer is particularly preferred.

When the monofunctional monomer is used as the plasticizer, melt fluidity can be maintained even if polymerization proceeds to some extent during high-temperature drying. Thus, the freedom of drying conditions can be increased. Examples of the monofunctional monomer usable as the plasticizer include epoxy monomers such as dibromophenyl glycidyl ether, p-tert-butylphenyl glycidyl ether, and phenyl glycidyl ether, available under the trade names of "EX-147", "EX-146", "EX-141" (product of Nagase ChemteX); and oxetane monomers such as 3-ethyl-3-((phenoxy)methyl))oxetane, 3-ethyl-3-((cyclohexyloxymethyl))oxetane, and 3-ethyl-3-(2-ethylhexyloxymethyl)oxetane, available under the trade names of ARON OXETANE "OXT-211" "OXT-213", and "OXT-212" (product of Toagosei).

A preferred mixing ratio of the phenoxy resin and the plasticizer in the present invention differs depending on the kind of the plasticizer. Based on 100 parts by weight of the phenoxy resin, the plasticizer is added in an amount selected from a range of from 1 part by weight to 30 parts by weight. When the amount of the plasticizer is less than 1 part by weight, its effect for improving the wiring burying property is lost. Amounts exceeding 30 parts by weight cause deterioration in adhesion properties and solder heat resistance. When the monofunctional oxetane monomer or monofunctional epoxy monomer is used as the plasticizer, it is preferably added in an amount ranging from 1 to 5 parts by weight.

Examples of the initiator for initiating polymerization or crosslink reaction of the epoxy-based or oxetane-based plasticizer include amine-based, imidazole-based, dicyandiamide-based, acid anhydride-based, and aromatic sulfonium salt-based cationic polymerization initiators. Of these, sulfonium salt-based initiators are preferred because they are excellent in thermal latency and in addition, the thermosetting adhesive composition and the heat resistant adhesive film obtained using it each have storage stability and are highly effective for suppressing an unnecessary reaction during drying.

Specific preferred examples of the commercially-available initiator for controlling the initiation temperature of polymerization or crosslink reaction of the epoxy-based or oxetane-based plasticizer to 160° C. or greater include "San-aid SI-150", "San-aid SI-160", and "San-aid SI-180" (each, trade name; product of Sanshin Chemical Industry). The initiator is added preferably in an amount of from 1 part by weight to 5 parts by weight based on 100 parts by weight of the total amount of the plasticizer component. When the thermosetting adhesive composition is provided as a varnish, a solvent such as cyclohexanone is preferably selected from the standpoint of the safety of the work.

A polyimide film is used preferably as a base film of the heat resistant adhesive film in the present invention from the standpoint of heat resistance. Although no particular limitation is imposed on the thickness of the polyimide film, it preferably falls within a range of from 25 μm to 100 μm from the standpoint of the handling property and the film cost. Examples of such polyimide film include "Kapton 100V", "Kapton 200V", "Kapton 100H", and "Kapton 200H" (each, trade name; product of DuPont Toray), and "Apical AH" and "Apical 25NPI" (trade name; product of Kaneka Corp.). The thickness of the adhesive layer formed on the polyimide film can be selected arbitrarily in accordance with the thickness of the conductor. When the thickness of the conductor is from 35 μm to 100 μm, the adhesive layer having a thickness of from 10 μm to 100 μm is preferably formed in consideration of the burying property of a conductor wiring.

According to the wiring film of the present invention, the adhesive force between the heat resistant adhesive film and the conductor wiring and between the heat resistant adhesive films can be enhanced by post-heating at the fusion bonding temperature or greater. The post-heating may be conducted preferably under the conditions of 180° C. or greater but less than 220° C. for 30 minutes to 60 minutes. Further, in the present invention, copper wirings coated with a metal layer containing any of tin, nickel, zinc and cobalt, or/and an oxide layer or hydroxide layer of the metal are preferably used as the conductor wirings. This can suppress oxidation of the copper surface to ensure stable adhesion properties. A copper wiring coated with nickel is preferred from the standpoint of long-term heat-resistance reliability. A layer of a foreign metal on the copper surface can be formed by using a plating method.

Further, a silane coupling agent containing at least one of an amino group, a vinyl group, a styryl group, an acrylate group, and a methacrylate group can be disposed on the outermost surface of the conductor wiring of the present invention. Since these silane coupling agents form a primary bond with the maleimide compound, they contribute to the improvement of the adhesion properties, heat resistance, and moisture resistance of the wiring film. Specific examples of the silane coupling agent include commercially available silane coupling agents such as N-2-(aminoethyl)-3-aminopropylmethyldimethoxysilane, N-2-(aminoethyl)-3-aminopropylmethyltrimethoxysilane, N-2-(aminoethyl)-3-aminopropylmethyltriethoxysilane, 3-aminopropyltrimethoxysilane, 3-aminopropyltriethoxysilane, 3-ureidopropyltrimethoxysilane, vinyltrimethoxysilane, vinyltriethoxysilane, 3-methacryloxypropylmethyldimethoxysilane, 3-methacryloxy propyltrimethoxysilane, 3-acryloxypropyltrimethoxysilane, p-styryltrimethoxysilane, and 3-(triethoxysilyl)propyl isocyanate. These silane coupling agents may also be used for the surface treatment of the inorganic needle-like fillers.

The surface treatment with the silane coupling agent is conducted by applying a 0.5 wt % to 8 wt % solution of the silane coupling agent in water or an organic solvent to a conductor wiring and then drying the resulting conductor wiring within a temperature range of from 100° C. to 150° C. for a range of from 10 minutes to 30 minutes.

Figure 15:
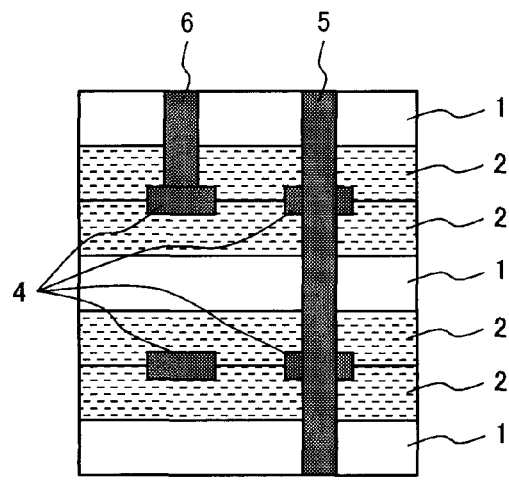
FIG. 15 is a schematic cross-sectional view showing an interlayer connection of the wiring film according to the present invention.
Figure 16:
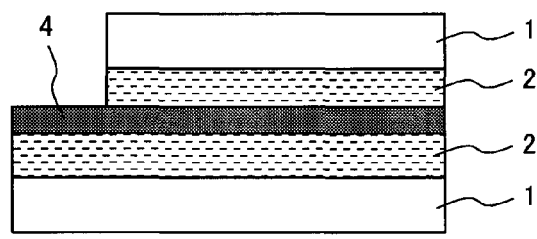
FIG. 16 is a schematic cross-sectional view of a ninth wiring film according to the present invention obtained by leading out the conductor wiring from the end portion of the wiring film.
Figure 17:
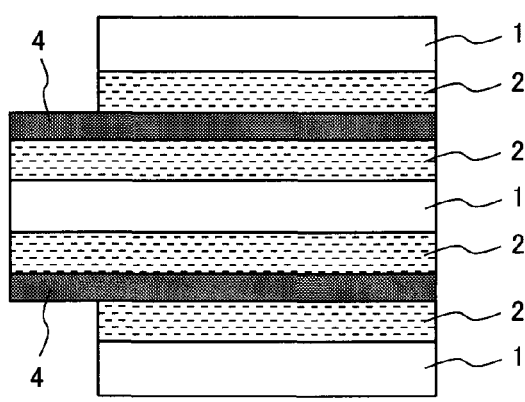
FIG. 17 is a schematic cross-sectional view of a tenth wiring film according to the present invention obtained by leading out the conductor wiring from the end portion of the wiring film.

In the wiring film of the present invention, a through-hole or blind via hole technique to be used for a multilayer printed board may be used to form interlayer connection and leading-out of the conductor wiring. A through-hole connection (5) and a blind via hole connection (6) are shown in FIG. 15. The conductor wiring 4 can also be lead out from the end of the wiring film as shown in FIG. 16 or 17.

EXAMPLES

The present invention will hereinafter be described in detail by Examples and Comparative Examples. The resin compositional ratio of the thermosetting adhesive composition and the solvent are shown in Table 1 on the weight basis. The mixing ratio of the inorganic needle-like fillers is a volume fraction (vol %) in the thermosetting adhesive composition.

The following are reagents and evaluation methods employed.
(1) Tested Samples

"BMI-1000": trade name of 4,4'-biphenylmethane bismaleimide, product of Daiwa Kasei Kogyo, melting temperature: from 147° C. to 168° C., gelling time at 200° C.: from 120 seconds to 150 seconds.

"BMI-4000": trade name of bisphenol A biphenyl ether bismaleimide, product of Daiwa Kasei Kogyo, melting temperature: from 134° C. to 163° C., gelling time at 250° C.: from 60 seconds to 90 seconds.

"BMI-2000": trade name of polyphenylmethane maleimide, product of Daiwa Kasei Kogyo, melting temperature: from 125° C. to 160° C., gelling time at 200° C.: from 180 seconds to 240 seconds.

"BMI-5000": trade name of 3,3'-dimethyl-5,5'-diethyl-4,4'-diphenylmethane bismaleimide, product of Daiwa Kasei Kogyo, melting temperature: from 130° C. to 154° C., gelling time at 250° C.: 110 seconds.

"BMI-TMH": trade name of 1,6-bismaleimido-(2,2,4-trimethyl)hexane, product of Daiwa Kasei Kogyo, melting temperature: from 73° C. to 110° C., gelling time at 250° C.: 126 seconds.

Phenoxy resin having a bisphenol S skeleton: "YPS-007A30", trade name; product of Toto Kasei (an n/m molar ratio: 3/7, polystyrene-equivalent average molecular weight: 40000).

Inorganic needle-like filler 1: "ALBOREX Y" (trade name), product of Shikoku Chemicals (fiber length: from 10 μm to 30 μm, fiber diameter: from 0.5 μm to 1.0 μm, specific gravity: 2.93 g/cm$^3$).

Inorganic needle-like filler 2: "SS10-420" (trade name), product of NITTOBO (fiber length: about 300 μm, fiber diameter: about 10 μm, specific gravity: 2.54 g/cm$^3$).

Spherical filler: Spherical SiO$_2$ filler "SO-E2" (trade name), product of Admatechs (average particle size: 0.5 μm, specific gravity: 2.2 g/cm$^3$).

Crushed filler: crushed SiO$_2$ filler "FS-20" (trade name), product of Denki Kagaku Kogyo (average particle size: 5.6 μm, specific gravity: 2.2 g/cm$^3$).

Coupling agent: "KBM602", trade name of N-β(aminoethyl)-γ-aminopropyltrimethoxysilane", product of Shin-Etsu Chemical.

Non-reactive plasticizer: "PX-200", trade name of 1,3-phenylenebis-dixylenylphosphate, product of Daihachi Chemical Industry.

Radical plasticizer: "TRIC", trade name of triallyl isocyanurate; product of Nippon Kasei Chemical.

Bifunctional epoxy-based plasticizer: "jER828", trade name; product of bisphenol A epoxy resin; product of Mitsubishi Chemical.

Cresol/novolac epoxy resin: "ADEKA OPTOMER KRM-2650", trade name; product of ADEKA.

Bisphenol A epoxy resin: "Ep-1001", trade name; product of Japan Epoxy resin.

Novolac phenol resin: "Resitop PSM-4261", product of Gun E1 Chemical Industry.

Monofunctional oxetane plasticizer: "Aron Oxetane OXT211", trade name of 3-ethyl-3-((phenoxy)methyl))oxetane; product of TOAGOSEI.

Cationic polymerization initiator 1: "San-Aid SI-160" (trade name, initiation temperature: about 167° C.), product of Sanshin Chemical Industry.

Cationic polymerization initiator 2: "San-Aid SI-100" (trade name, initiation temperature: about 100° C.), product of Sanshin Chemical Industry.

Cationic polymerization initiator 3: "CP-66" (trade name; initiation temperature: about 160° C.), product of ADEKA.

Thermosetting low-molecular PPE: "OPE2St" (trade name), product of Mitsubishi Gas Chemical, polystyrene-equivalent average molecular weight: about 1000.

Hydrogenated styrene elastomer: "Tuftec H1052" (trade name) product of Asahi Chemicals.

Radical polymerization initiator: "Perhexa V" (trade name) product of NOF.

Polyimide film: "Kapton 100V" (trade name; thickness: 25 μm), product of DuPont Toray Co.

Copper foil 1: A copper foil of 18 μm thick having a 100 nm thick tin plated layer on the surface thereof, and further having tin hydroxide or oxide on the surface of the tin plated layer. The surface of this copper foil was subjected to aminosilane treatment. Aminosilane treatment conditions: Copper foil 1 was dipped in a 51 aqueous solution of N-β(aminoethyl)-γ-aminopropyltrimethoxysilane for one minute and was then taken out from the solution. The resulting copper foil was then dried at 120° C. for 30 minutes to form an aminosilane layer on the surface thereof.

Copper foil 2: A copper foil of 100 μm thick having a nickel plated layer of 500 nm thick on the surface thereof, and further having nickel hydroxide or oxide on the surface of the nickel plated layer. The surface of this copper foil was subjected to aminosilane treatment. Aminosilane treatment conditions: Copper foil 2 was dipped in a 1% aqueous solution of N-β(aminoethyl)-γ-aminopropyltrimethoxysilane for one minute and was then taken out from the solution. The resulting copper foil was then dried at 120° C. for 30 minutes to form an aminosilane layer on the surface thereof.
(2) Preparation of Varnish of Thermosetting Adhesive Composition A varnish of the thermosetting adhesive composition was prepared by mixing components at a predetermined mixing ratio, adding cyclohexanone to the resulting mixture to give a solid concentration of 30 wt %, and stirring the resulting solution to dissolve the resin component.
(3) Formation of Heat Resistant Adhesive Film A heat resistant adhesive film was formed by applying the adhesive varnish onto a polyimide film by using a bar coater having a predetermined gap and drying the resulting film at 160° C. for 30 minutes. The thickness of the adhesive layer was adjusted to 30 μm.

(4) Preparation of a Resin Plate and Measurement of Volume Fraction

The varnish of a thermosetting adhesive composition was applied onto a sheet made of polytetrafluoroethylene (PTFE) and the resulting sheet was dried at 160° C. for 30 minutes. The dried adhesive layer was separated from the PTFE sheet to obtain about 5 g of the thermosetting adhesive composition. A 30 mm×80 mm×1 mm spacer made of PTFE was filled with the resulting thermosetting adhesive composition, followed by press molding under the conditions of 3 MPa and 180° C./60 minutes under vacuum via a 0.1-mm thick PTFE sheet and a mirror sheet to prepare a resin plate. The specific gravity of the resin plate was measured using a gravimeter "MD-300S" (trade name; product of Alfa Mirage Co., Ltd.) to determine the respective volume fractions of the inorganic needle-like filler and resin component in the thermosetting adhesive composition.

(5) Evaluation of Curl of Heat Resistant Adhesive Film

Figure 18A:
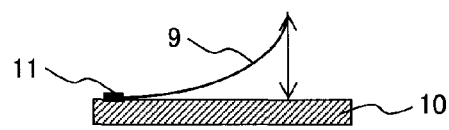
FIG. 18A is a schematic cross-sectional view showing an evaluation method of the curl of the heat resistant adhesive film and a desirable result.
Figure 18B:
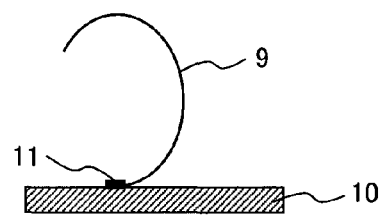
FIG. 18B is a schematic cross-sectional view showing an undesirable result in the evaluation method of the curl of the heat resistant adhesive film.

A heat resistant adhesive film 9 having on one side thereof an adhesive layer was cut into a 2.5 cm×5 cm piece. As shown in FIGS. 18A and 18B, one of the short sides was fixed to a glass substrate 10 with a double-coated tape 11. The width of the fixed portion was set at 1 mm. An average height (mm) between both edges of the sample which had warped as shown in FIG. 18A from the glass substrate was observed as the index of a curl. The sample which had curled strongly as shown in FIG. 18B was evaluated "x" in Table 2 etc. as described below. The term "strong curl (curled strongly)" means that the position of the edge of the curl exceeds the vertical line on the double-coated tape 11.

(6) Evaluation of Adhesive Strength in B-Stage Form

Copper foil 1 was placed on the surface of the heat resistant adhesive film on the side of the adhesive layer and they were adhered by heating and applying pressure for 10 minutes under the conditions of 160° C. and 1 MPa. The sample thus obtained was cut into a 1-cm wide and 5-cm long piece. A 180° peel test was performed between the copper film and the heat resistant adhesive film to determine the adhesive force in B-stage form.

(7) Evaluation of Adhesive Force after Post Curing

Copper foil 1 was placed on the surface of the heat resistant adhesive film on the side of the adhesive layer and they were adhered by heating and applying pressure for 10 minutes under the conditions of 160° C. and 1 MPa. Further, the resulting film was post-heated in the air without pressure at 180° C. for 60 minutes. The sample thus obtained was cut into a 1-cm wide and 5-cm long piece. A 180° peel test was performed between the copper foil and the heat resistant adhesive film to determine the post-curing adhesive force.

(8) Evaluation of Adhesive Force After Moisture Resistance Test

Copper foil 1 plated with tin was placed on the surface of the heat resistant adhesive film on the side of the adhesive layer and they were adhered by heating and applying pressure for 10 minutes under the conditions of 160° C. and 1 MPa. Further, the film thus obtained was post-heated in the air without pressure at 180° C. for 30 minutes. Then, the post-heated film was exposed to saturated water vapor for 24 hours at 121° C. and 2 atm. The sample thus obtained was cut into a 1-cm wide and 5-cm long piece. A 180° peel test was performed between the copper film and the heat resistant adhesive film to determine the adhesive force after moisture resistance test.

(9) Solder Heat-Resistance Test

Copper foil 1 plated with tin was placed on the surface of the heat resistant adhesive film on the side of the adhesive layer and they were adhered by heating and applying pressure for 10 minutes under the conditions at 160° C. and 1 MPa. The resulting film was then post-heated in the air without pressure at 180° C. for 30 minutes. The sample thus obtained was floated in a soldering bath of 280° C. and kept for one minute. As a result of visual inspection, samples with no swelling were evaluated "○" and samples with swelling were evaluated "x".

(10) Wiring Burying Property

Figure 19A:
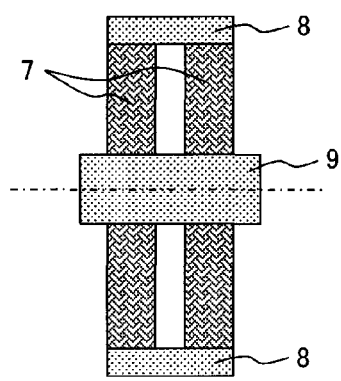
FIG. 19A is a schematic plan view of a sample for evaluating a wiring burying property.
Figure 19B:
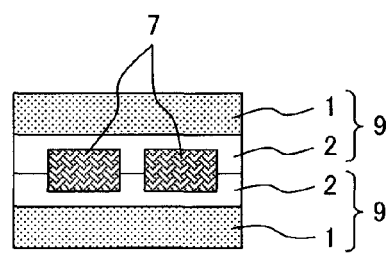
FIG. 19B is a schematic cross-sectional view of the sample for evaluating the wiring burying property.

A schematic plan view and a schematic cross-sectional view of a sample used for evaluation are shown in FIG. 19A and FIG. 19B, respectively.

In these figures, the sample is constructed of a base film 1, an adhesive layer 2 and a copper foil 7, and the base film 1 and the adhesive layer 2 form a heat resistant adhesive film 9. A polyimide tape 8 is for fixing.

First, a nickel-plated 100-μm thick copper foil 7 was cut into 1-cm wide and 5-cm long pieces. They were arranged with a distance of 1 mm as shown in FIG. 19A and FIG. 19B and end portions were fixed with the polyimide tape 8. Then, the copper foil 7 was vertically sandwiched between two heat resistant adhesive films 9 having an adhesive layer on one side thereof and they were adhered by applying pressure not greater than 6 MPa at 160° C.

Figure 20A:
FIG. 20A is a micrograph showing an example of the evaluation of the wiring burying property, in which wirings have not been buried well.
Figure 20B:
FIG. 20B is a micrograph showing another example of the evaluation of the wiring burying property, in which wirings have been buried well.

After adhesion, the wiring burying property between two copper foils was observed using an optical microscope. The observation examples are shown in FIG. 20A and FIG. 20B. The sample has an un-adhered portion between the copper foils 7 in FIG. 20A. It is indicated by "x" in Tables described below.

On the other hand, the sample has copper foils 7 filled with the resin therebetween in FIG. 20B. It is indicated by "○" in Tables described below.

(11) Storage Stability of Heat-Resistant Adhesive Film

The heat-resistant adhesive films were stored for 30 days in a clean room controlled to about 25° C. Then, the tests from (7) to (9) were made. The heat-resistant adhesive films having an adhesive force of 0.7 kN/m or greater between the copper foil and the heat resistant adhesive film and having good solder heat resistance were evaluated good and indicated by "○" in Tables described below.

(12) Long-Term Heat-Resistance Reliability

Copper foil plated with nickel and having a thickness of 100 μm and the surface of the heat resistant adhesive film on the side of the adhesive layer were overlapped with each other and they were adhered by heating and applying pressure for 10 minutes under the conditions of 160° C. and 1 MPa. Further, the resulting film was post-heated at 180° C. for 30 minutes without applying pressure in the atmosphere to prepare an adhesion sample. Forty adhesion samples of about 6 cm×6 cm were prepared. Ten adhesion samples were put in temperature-controlled baths heated to 160° C., 180° C., 200° C., and 220° C. respectively in the atmosphere to make a heat deterioration test. One of the adhesion samples was taken out at regular time intervals and a 180° peel test was conducted to observe the adhesive force. In each deterioration temperature, the time required for the adhesive force to reach 0.7 kN/m was determined as lifetime.

Figure 21:
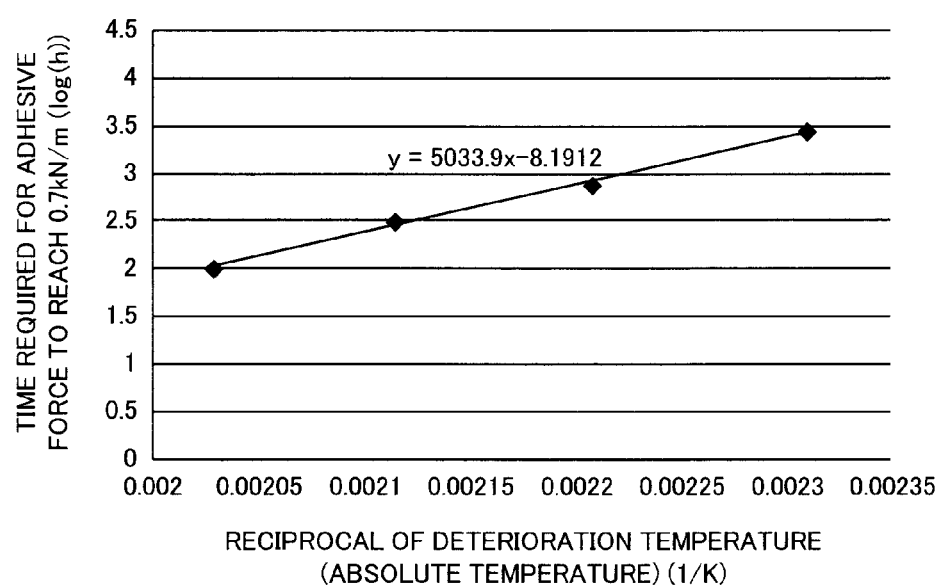
FIG. 21 is an Arrhenius plot showing results of a long-term heat resistance test based on an adhesive force between the heat resistant adhesive film and a copper foil.

In FIG. 21, an Arrhenius plot was made by plotting the logarithm of the lifetime along the ordinate and plotting the reciprocal of the absolute temperature (K) of the deterioration temperature along the abscissa. The resulting plot was exploited based on linear approximation and a deterioration temperature at which the lifetime hours reach 20000 was determined as a long-term heat resistance index (heat-resistance index) of the heat resistant adhesive film.

Comparative Examples 1 to 5

The composition of each of the thermosetting adhesive compositions of Comparative Examples 1 to 5 is described in Table 1. Comparative Examples 1 to 5 are examples of a thermosetting adhesive composition containing no inorganic needle-like filler. The properties of a heat resistant adhesive film obtained by applying each of the thermosetting adhesive compositions onto a polyimide film, followed by drying and a laminated film obtained by fusion bonding of the heat resistant adhesive film and a copper foil are shown in Table 2. Although the heat resistant adhesive films of Comparative Examples 1 to 5 and the laminated films using them were excellent in adhesion properties, moisture resistance, solder heat resistance, storage stability, and wiring burying property, strong curl was observed from any of the heat resistant adhesive films. The heat resistant adhesive films of Comparative Examples 1 to 5 have therefore a problem of strong curling.

Examples 1 to 6

The composition of each of the thermosetting adhesive compositions of Examples 1 to 6 is described in Table 3. Examples 1 to 6 are examples of a thermosetting adhesive composition containing inorganic needle-like fillers. The properties of a heat resistant adhesive film obtained by applying each of the thermosetting adhesive compositions onto a polyimide film, followed by drying and a laminated film obtained by fusion bonding of the heat resistant adhesive film and a copper foil are shown in Table 4. Occurrence of the strong curl was suppressed in the heat resistant adhesive films of Examples 1 to 6 and the warps as small as from 4 to 10 mm were observed. The addition of inorganic needle-like fillers was therefore effective for suppressing the strong curl. With regard to the adhesive force, the heat resistant adhesive films had an adhesive force of from 1.0 to 1.3 kN/m even after the moisture resistance test and had good 280° C. solder heat resistance and storage stability. These findings have suggested that the heat resistant adhesive films made of each of the thermosetting adhesive compositions of Examples 1 to 6 and a polyimide film do not curl easily and have excellent storage stability, and laminated films and wiring films using them are excellent in adhesion properties, moisture resistance, and solder heat resistance.

Next, thermosetting adhesive compositions of Comparative Examples 6 to 8 and Examples 7 to 8 will be explained.

Table 5 shows components of the thermosetting adhesive compositions.

In addition, Table 6 shows an adhesive force, a solder heat resistance, a storage stability and a wiring burying property which are properties of laminated films obtained by adhering heat resistant adhesive films made of the thermosetting adhesive compositions and polyimide, and copper foils to each other by fusion bonding.

Comparative Example 6

Comparative Example 6 is an example of a thermosetting adhesive composition containing inorganic needle-like fillers excessively. It has been revealed that the resulting heat resistant adhesive film had an adhesive force as low as about 0.4 kN/m though occurrence of strong curl was suppressed.

Comparative Examples 7 and 8

Comparative Examples 7 and 8 are examples of thermosetting adhesive compositions containing spherical fillers and crushed fillers, respectively.

The heat resistant adhesive films of Comparative Examples 7 and 8 curled strongly. This finding has revealed that both the spherical fillers and crushed fillers are less effective for suppressing the films from curling.

Examples 7 and 8

Examples 7 and 8 are examples of thermosetting adhesive compositions containing inorganic needle-like fillers in an amount different from the above-described ones. In the heat resistant adhesive films obtained in the present examples, the occurrence of the curl was suppressed and only the warps as small as from 4 to 9 mm were observed. With regard to the adhesive force, the heat resistant films had the adhesive force of from 0.9 to 1.2 kNm even after the moisture resistance test and it had good 280° C. solder heat resistance and storage stability. The wiring burying property in Examples 7 and 8 was excellent and comparable to that of Comparative Examples 1 to 5 containing no inorganic needle-like fillers. It has been understood from these findings that the heat resistant adhesive films of Examples 7 and 8 do not curl easily and have excellent storage stability, and laminated films and wiring films using them are excellent in adhesion properties, moisture resistance, and solder heat resistance.

Next, thermosetting adhesive compositions of Comparative Example 9 and Examples 9 to 10 will be explained.

Table 7 shows components of the thermosetting adhesive compositions.

In addition, Table 8 shows the adhesive force, the solder heat resistance, the storage stability and the wiring burying property which are the properties of the laminated films obtained by adhering the heat resistant adhesive films made of the thermosetting adhesive compositions and the polyimide, and the copper foils to each other by the fusion bonding.

Comparative Example 9

Comparative Example 9 is an example of a thermosetting adhesive composition containing a non-reactive plasticizer excessively. It has been found that the heat resistant adhesive film has an adhesive force as low as from 0.4 to 0.6 kN/m and has low solder heat resistance though the occurrence of the strong curl is suppressed and the wiring burying property under pressure as low as 1 MPa is good.

Examples 9 and 10

Examples 9 and 10 are examples of a thermosetting adhesive composition containing a non-reactive plasticizer in an amount different from the above-described one. In the heat resistant adhesive films of these Examples, the strong curl was suppressed and only warps as small as from 7 mm to 10 mm were observed. With regard to the adhesive force, the film had the adhesive force of from 0.8 kN/m to 1.0 kN/m even after the moisture resistance test and had good 280° C. solder heat resistance and storage stability. The wiring burying property under pressure of 3 MPa was also good. It has been understood from these findings that the heat resistant adhesive films obtained using the thermosetting adhesive compositions of Examples 9 and 10 and the polyimide film do not curl easily and have excellent storage stability and laminated films and wiring films using them are excellent in the adhesion properties, the moisture resistance and the solder heat resistance.

Next, thermosetting adhesive compositions of Comparative Example 10 and Examples 11 to 12 will be explained.

Table 9 shows components of the thermosetting adhesive compositions.

In addition, Table 10 shows the adhesive force, the solder heat resistance, the storage stability and the wiring burying property which are the properties of the laminated films obtained by adhering the heat resistant adhesive films made of the thermosetting adhesive compositions and the polyimide, and the copper foils to each other by the fusion bonding.

Comparative Example 10

Comparative Example 10 is an example of a thermosetting adhesive composition containing a radical polymerizable plasticizer excessively. It has been revealed that the heat resistant adhesive film has lost a strong curl suppressing effect although the solder heat resistance and the adhesion properties are excellent.

Examples 11 and 12

Examples 11 and 12 are examples of thermosetting adhesive compositions containing a radical polymerizable plasticizer in an amount different from the above-described one. In the heat resistant adhesive films of these Examples, the occurrence of the strong curl was suppressed and only warps as small as from 18 to 23 mm were found. With regard to the adhesive force, the film had an adhesive force of from 0.8 to 0.9 kN/m even after the moisture resistance test and it had also good 280° C. solder heat resistance. In addition, it had a good wiring burying property.

These findings have suggested that the heat resistant adhesive film made of each of the thermosetting adhesive compositions of Examples 11 and 12 and a polyimide film does not curl easily and laminated films and wiring films using it are excellent in the adhesion properties, the moisture resistance and the solder heat resistance.

Next, thermosetting adhesive compositions of Examples 13 to 14 and Comparative Examples 11 to 12 will be explained.

Table 11 shows components of the thermosetting adhesive compositions.

In addition, Table 12 shows the adhesive force, the solder heat resistance, the storage stability and the wiring burying property which are the properties of the laminated films obtained by adhering the heat resistant adhesive films made of the thermosetting adhesive compositions and the polyimide, and the copper foils to each other by the fusion bonding.

Examples 13 and 14

Examples 13 and 14 are examples of a thermosetting adhesive composition containing an epoxy-based plasticizer. In the heat resistant adhesive films of these Examples, the occurrence of the strong curl was suppressed and only warps as small as from 12 to 14 mm were found. With regard to the adhesive force, the film had an adhesive force of from 0.8 to 0.9 kN/m even after moisture resistance test and had also good 280° C. solder heat resistance and storage stability. In addition, it had a good wiring burying property. These findings have suggested that the heat resistant adhesive film made of each of the thermosetting adhesive compositions of Examples 13 and 14 and the polyimide film does not curl easily and has excellent storage stability, and laminated films and wiring films using it are excellent in the adhesion properties, the solder heat resistance, and the moisture resistance.

Comparative Example 11

Comparative Example 11 is an example of a thermosetting adhesive composition containing, as a polymerization initiator of an epoxy-based plasticizer, "SI-100" having a reaction initiation temperature of about 100° C. The adhesive force, the wiring burying property and the solder heat resistance of them were insufficient, which was presumed to occur due to the progress of the curing of the plasticizer during drying of the adhesive layer.

Comparative Example 12

Comparative Example 12 is an example of a thermosetting adhesive composition containing an epoxy-based plasticizer excessively. Although the heat resistant adhesive film of this example was excellent in the wiring burying property and the strong-curl suppressing effect, it had insufficient adhesive force and solder heat resistance.

Next, thermosetting adhesive compositions of Examples 15 to 16 and Comparative Example 13 will be explained.

Table 13 shows components of the thermosetting adhesive compositions.

In addition, Table 14 shows the adhesive force, the solder heat resistance, the storage stability and the wiring burying property which are the properties of the laminated films obtained by adhering the heat resistant adhesive films made of the thermosetting adhesive compositions and the polyimide, and the copper foils to each other by the fusion bonding.

Examples 15 and 16

Examples 15 and 16 are examples of a thermosetting adhesive composition containing a monofunctional oxetane-based plasticizer. In the heat resistant adhesive films of these Examples, occurrence of strong curl was suppressed and only warps as small as from 12 to 15 mm were found. The film had the adhesive force of 1.1 kN/m even after moisture resistance test. In addition, it had good 280° C. solder heat resistance and storage stability. Further, it had a good wiring burying property under pressure of 1 MPa. These findings have suggested that the heat resistant adhesive film made of each of the thermosetting adhesive compositions of Examples 15 and 16 and a polyimide film does not curl easily and has excellent storage stability and the laminated film and wiring film using it are excellent in the adhesion properties, the solder heat resistance and the moisture resistance.

Comparative Example 13

Comparative Example 13 is an example of a thermosetting adhesive composition containing an oxetane-based plasticizer excessively. The heat resistant adhesive film of this example was excellent in the wiring burying property and the strong-curl suppressing effect, but it was insufficient in the adhesive force and the solder heat resistance.

Next, thermosetting adhesive compositions of Examples 17 to 24 and Comparative Examples 14 to 17 will be explained.

Table 15 shows components of the thermosetting adhesive compositions.

In addition, Table 16 shows the adhesive force, the solder heat resistance, the storage stability and the wiring burying property which are the properties of the laminated films obtained by adhering the heat resistant adhesive films made of the thermosetting adhesive compositions and the polyimide, and the copper foils to each other by the fusion bonding.

Examples 17 to 24

Examples 17 to 24 are examples of a thermosetting adhesive composition containing a maleimide resin in an amount different from the above-described one. In the heat resistant adhesive films of these Examples, the occurrence of the strong curl was suppressed and only warps as small as from 4 to 15 mm were found. The film had the adhesive force of from 0.9 to 1.3 kN/m even after moisture resistance test and it also had good 280° C. solder heat resistance and storage stability. These findings have suggested that the heat resistant adhesive film made of each of the thermosetting adhesive compositions of Examples 17 to 24 and a polyimide film does not curl easily and has excellent storage stability and laminated films and wiring films using it are excellent in the adhesion properties, the solder heat resistance and the moisture resistance.

Comparative Examples 14 to 17

Comparative Examples 14 to 17 are examples of a thermosetting adhesive composition containing a maleimide resin excessively. The heat resistant adhesive films of these Comparative Examples were insufficient in adhesive force and 280° C. solder heat resistance though the occurrence of the curl was suppressed.

Example 25

In order to find long-term heat-resistance reliability of the adhesion interface between the heat resistant adhesive film described in Example 16 and the nickel-plated copper foil 2, a heat-resistance index based on adhesive force was studied. An Arrhenius plot in which the reciprocal of deterioration temperature (absolute temperature) and logarithm of deterioration time required for the adhesive force to reach 0.7 kN/m have been plotted is shown in FIG. 21. The heat-resistance index determined from the Arrhenius plot was about 130° C. It has been found from the finding that the heat resistant adhesive film obtained by placing, on a polyimide film, as an adhesive layer, the thermosetting adhesive composition of the present invention composed mainly of bismaleimide and a phenoxy resin containing a bisphenol S skeleton, and a laminated film and a wiring film using it are excellent in long-term heat-resistance reliability.

Example 26

A pseudo wiring film was formed by using the heat resistant adhesive film of Example 16. The steps are shown below.

(1) The heat resistant adhesive film was cut into a 10 cm×2 cm piece and ten rectangular copper wires (each 300 µm wide and 35 µm thick) were placed at 1 mm intervals on the surface of the adhesive layer of the resulting piece.

(2) Another heat-resistant adhesive film cut into a 9 cm×2 cm piece was prepared and it was placed on the copper wirings while aligning the long-axis direction thereof with that of the above-mentioned heat resistant adhesive film and bringing the surface of the adhesive layer into contact with the copper wirings.

(3) The laminate thus obtained was then put between polyethylene terephthalate films subjected to releasing treatment and pressed under the conditions of 160° C., 10 minutes, and 1 MPa to bond the copper wirings and the above-mentioned two heat-resistant adhesive films with the copper wirings therebetween.

The laminate was taken out from the polyethylene terephthalate films and post-heated at 180° C. for 60 minutes to form a pseudo wiring film having, at the end portion thereof, an electrode. The sample thus obtained had a good wiring burying property and caused neither cracking nor peeling even after the high-temperature and high-humidity test or solder heat resistance test. Thus, it is desirable as a heat-resistant wiring film.

TABLE 1

| | | Comp. Ex. 1 | Comp. Ex. 2 | Comp. Ex. 3 | Comp. Ex. 4 | Comp. Ex. 5 |
|---|---|---|---|---|---|---|
| Phenoxy resin | YPS-007A30 | 100 | 100 | 100 | 100 | 100 |
| Maleimide compound | BMI-1000 | 17.6 | 0 | 0 | 0 | 0 |
| | BMI-2000 | 0 | 17.6 | 0 | 0 | 0 |
| | BMI-4000 | 0 | 0 | 17.6 | 0 | 0 |
| | BMI-5000 | 0 | 0 | 0 | 17.6 | 0 |
| | BMI-TMH | 0 | 0 | 0 | 0 | 17.6 |

TABLE 2

| | | Comp. Ex. 1 | Comp. Ex. 2 | Comp. Ex. 3 | Comp. Ex. 4 | Comp. Ex. 5 |
|---|---|---|---|---|---|---|
| Curl (mm) | | x | x | x | x | x |
| Adhesive force (kN/m) | Post-cured product | 1 | 1.4 | 1.1 | 1.3 | 1.2 |
| | After moisture resistance test | 1.2 | 1.2 | 1 | 1.1 | 1 |
| Solder heat resistance | | ○ | ○ | ○ | ○ | ○ |
| Storage stability | | ○ | ○ | ○ | ○ | ○ |
| Wiring burying property | Laminating pressure: 6 MPa | ○ | ○ | ○ | ○ | ○ |

TABLE 3

| | | Ex. 1 | Ex. 2 | Ex. 3 | Ex. 4 | Ex. 5 | Ex. 6 |
|---|---|---|---|---|---|---|---|
| Phenoxy resin | YPS-007A30 | 100 | 100 | 100 | 100 | 100 | 100 |
| Maleimide compound | BMI-1000 | 17.6 | 0 | 0 | 0 | 0 | 0 |
| | BMI-2000 | 0 | 17.6 | 0 | 0 | 0 | 0 |
| | BMI-4000 | 0 | 0 | 17.6 | 0 | 0 | 0 |
| | BMI-5000 | 0 | 0 | 0 | 17.6 | 0 | 0 |
| | BMI-TMH | 0 | 0 | 0 | 0 | 17.6 | 17.6 |
| Needle-like filler (vol %) | ALBOREX Y | 7.8 | 7.8 | 7.8 | 7.8 | 7.8 | 0 |
| | SS10-420 | 0 | 0 | 0 | 0 | 0 | 9.5 |
| Coupling agent | KBM602 | 0.2 | 0.2 | 0.2 | 0.2 | 0.2 | 0.2 |

TABLE 4

| | | Ex. 1 | Ex. 2 | Ex. 3 | Ex. 4 | Ex. 5 | Ex. 6 |
|---|---|---|---|---|---|---|---|
| Curl (mm) | | 9 | 4 | 6 | 7 | 7 | 10 |
| Adhesive force (kN/m) | Post-cured product | 1.3 | 1.5 | 1.2 | 1.3 | 1.1 | 1.2 |
| | After moisture resistance test | 1.2 | 1.3 | 1.1 | 1.1 | 1 | 1 |
| Solder heat resistance | | ○ | ○ | ○ | ○ | ○ | ○ |
| Storage stability | | ○ | ○ | ○ | ○ | ○ | ○ |

TABLE 4-continued

|  |  | Ex. 1 | Ex. 2 | Ex. 3 | Ex. 4 | Ex. 5 | Ex. 6 |
|---|---|---|---|---|---|---|---|
| Wiring burying property | Laminating pressure: 6 MPa | ○ | ○ | ○ | ○ | ○ | ○ |

TABLE 5

|  |  | Ex. 7 | Ex. 8 | Comp. Ex. 6 | Comp. Ex. 7 | Comp. Ex. 8 |
|---|---|---|---|---|---|---|
| Phenoxy resin | YPS-007A30 | 100 | 100 | 100 | 100 | 100 |
| Maleimide compound | BMI-1000 | 17.6 | 17.6 | 17.6 | 17.6 | 17.6 |
| Needle-like filler (vol %) | ALBOREX Y | 3 | 20 | 30 | 0 | 0 |
| Spherical filler (vol %) | SO-E2 | 0 | 0 | 0 | 3 | 0 |
| Crushed filler (vol %) | FS-20 | 0 | 0 | 0 | 0 | 3 |
| Coupling agent | KBM602 | 0.1 | 0.5 | 1.2 | 0.1 | 0.1 |

TABLE 6

|  |  | Ex. 7 | Ex. 8 | Comp. Ex. 6 | Comp. Ex. 7 | Comp. Ex. 8 |
|---|---|---|---|---|---|---|
|  | Curl (mm) | 9 | 4 | 1 | x | x |
| Adhesive force (kN/m) | Post-cured product | 1.3 | 1.5 | 0.4 | 1.3 | 1.3 |
|  | After moisture resistance test | 1.2 | 0.9 | 0.3 | 1.2 | 1.2 |
|  | Solder heat resistance | ○ | ○ | x | ○ | ○ |
|  | Storage stability | ○ | ○ | — | ○ | ○ |
| Wiring burying property | Laminating pressure: 6 MPa | ○ | ○ | x | ○ | ○ |

TABLE 7

|  |  | Ex. 9 | Ex. 10 | Comp. Ex. 9 |
|---|---|---|---|---|
| Phenoxy resin | YPS-007A30 | 100 | | |
| Maleimide compound | BMI-1000 | 17.6 | | |
| Needle-like filler (vol %) | ALBOREX Y | 7.8 | | |
| Coupling agent | KBM602 | 0.2 | | |
| Plasticizer | PX-200 | 2.4 | 30 | 50 |

TABLE 8

|  |  | Ex. 9 | Ex. 10 | Comp Ex. 9 |
|---|---|---|---|---|
|  | Curl (mm) | 7 | 10 | 15 |
| Adhesive force (kN/m) | Post-cured product | 1.1 | 0.9 | 0.6 |
|  | After moisture resistance test | 1 | 0.8 | 0.4 |
|  | Solder heat resistance | ○ | ○ | x |
|  | Storage stability | ○ | ○ | — |
| Wiring burying property | Laminating pressure: 6 MPa | ○ | ○ | ○ |

TABLE 9

|  |  | Ex. 11 | Ex. 12 | Comp. Ex. 10 |
|---|---|---|---|---|
| Phenoxy resin | YPS-007A30 | 100 | | |
| Maleimide compound | BMI-1000 | 17.6 | | |
| Needle-like filler (vol %) | ALBOREX Y | 7.8 | | |
| Coupling agent | KBM602 | 0.2 | | |
| Plasticizer | TAIC | 10 | 30 | 50 |

TABLE 10

|  |  | Ex. 11 | Ex. 12 | Comp Ex. 10 |
|---|---|---|---|---|
|  | Curl (mm) | 18 | 23 | x |
| Adhesive force (kN/m) | Post-cured product | 1.1 | 0.9 | 0.9 |
|  | After moisture resistance test | 0.9 | 0.8 | 0.8 |
|  | Solder heat resistance | ○ | ○ | ○ |
| Wiring burying property | Laminate pressure: 6 MPa | ○ | ○ | ○ |

TABLE 11

|  |  | Ex. 13 | Ex. 14 | Comp. Ex. 11 | Comp. Ex. 12 |
|---|---|---|---|---|---|
| Phenoxy resin | YPS-007A30 | 100 | | | |
| Maleimide compound | BMI-1000 | 17.6 | | | |
| Needle-like filler (vol %) | ALBOREX Y | 7.8 | | | |
| Coupling agent | KBM602 | 0.2 | | | |
| Plasticizer | jER828 | 5 | 10 | 10 | 50 |
| Polymerization initiator | SI-160 | 0.1 | 0.2 | 0 | 1 |
|  | SI-100 | 0 | 0 | 0.2 | 0 |

TABLE 12

|  |  | Ex. 13 | Ex. 14 | Comp. Ex. 11 | Comp. Ex. 12 |
|---|---|---|---|---|---|
|  | Curl (mm) | 12 | 14 | 14 | 4 |
| Adhesive force (kN/m) | Post-cured product | 1 | 0.9 | 0.5 | 0.3 |
|  | After moisture resistance test | 0.9 | 0.8 | — | — |
|  | Solder heat resistance | ○ | ○ | x | x |
|  | Storage stability | ○ | ○ | — | — |
| Wiring burying property | Laminate pressure: 6 MPa | ○ | ○ | x | ○ |

TABLE 13

|  |  | Ex. 15 | Ex. 16 | Comp. Ex. 13 |
|---|---|---|---|---|
| Phenoxy resin | YPS-007A30 | 100 | | |
| Maleimide compound | BMI-1000 | 17.6 | | |
| Needle-like filler (vol %) | ALBOREX Y | 7.8 | | |
| Coupling agent | KBM602 | 0.2 | | |
| Plasticizer | OXT211 | 2 | 5 | 50 |
| Polymerization initiator | SI-160 | 0.2 | 0.2 | 1 |

TABLE 14

|  |  | Ex. 15 | Ex. 16 | Comp. Ex. 13 |
|---|---|---|---|---|
| Adhesive force (kN/m) | Curl (mm) | 12 | 15 | 0 |
|  | Post-cured product | 1.2 | 1.1 | 0.5 |
|  | After moisture resistance test | 1.1 | 1.1 | — |
|  | Solder heat resistance | ○ | ○ | x |
|  | Storage stability | ○ | ○ | — |
| Wiring burying property | Laminating pressure: 6 MPa | ○ | ○ | ○ |

TABLE 15

|  |  | Ex. 17 | Ex. 18 | Ex. 19 | Ex. 20 | Ex. 21 | Ex. 22 | Ex. 23 | Ex. 24 | Comp. Ex. 14 | Comp. Ex. 15 | Comp. Ex. 16 | Comp. Ex. 17 |
|---|---|---|---|---|---|---|---|---|---|---|---|---|---|
| Phenoxy resin | YPS-007A30 | 100 | 100 | 100 | 100 | 100 | 100 | 100 | 100 | 100 | 100 | 100 | 100 |
| Maleimide compound | BMI-1000 | 5 | 30 | 0 | 0 | 0 | 0 | 0 | 0 | 60 | 0 | 0 | 0 |
|  | BMI-2000 | 0 | 0 | 5 | 30 | 0 | 0 | 0 | 0 | 0 | 60 | 0 | 0 |
|  | BMI-5000 | 0 | 0 | 0 | 0 | 5 | 30 | 0 | 0 | 0 | 0 | 60 | 0 |
|  | BMI-TMH | 0 | 0 | 0 | 0 | 0 | 0 | 5 | 30 | 0 | 0 | 0 | 60 |
| Needle-like filler (vol %) | ALBOREX Y | 8.6 | 7.1 | 8.6 | 7.1 | 8.6 | 7.1 | 8.6 | 7.1 | 5.8 | 5.8 | 5.8 | 5.8 |
| Coupling agent | KBM602 | 0.2 | 0.2 | 0.2 | 0.2 | 0.2 | 0.2 | 0.2 | 0.2 | 0.2 | 0.2 | 0.2 | 0.2 |

TABLE 16

|  |  | Ex. 17 | Ex. 18 | Ex. 19 | Ex. 20 | Ex. 21 | Ex. 22 | Ex. 23 | Ex. 24 | Comp. Ex. 14 | Comp. Ex. 15 | Comp. Ex. 16 | Comp. Ex. 17 |
|---|---|---|---|---|---|---|---|---|---|---|---|---|---|
|  | Curl (mm) | 5 | 13 | 4 | 11 | 4 | 12 | 4 | 15 | 20 | 18 | 18 | 20 |
| Adhesive force (kN/m) | Post-cured product | 1.1 | 1.4 | 1.2 | 1.5 | 1.1 | 1 | 1.1 | 1 | 0.2 | 0.3 | 0.1 | 0.1 |
|  | After moisture resistance test | 0.9 | 1.2 | 0.9 | 1.3 | 0.9 | 0.9 | 0.9 | 0.9 | — | — | — | — |
|  | Solder heat resistance | ○ | ○ | ○ | ○ | ○ | ○ | ○ | ○ | x | x | x | x |
|  | Storage stability | ○ | ○ | ○ | ○ | ○ | ○ | ○ | ○ | — | — | — | — |
| Wiring burying property | Laminating pressure: 6 MPa | ○ | ○ | ○ | ○ | ○ | ○ | ○ | ○ | ○ | ○ | ○ | ○ |

The heat resistant adhesive film of the present invention is suited for an insulation adhesive sheet, for example, TAB tape, FPC, FFC, and MFJ. In addition, the wiring film of the present invention has excellent heat resistance so that it is suited for a wiring member of automobiles and electronic and electric apparatuses.

What is claimed is:

1. A thermosetting adhesive composition comprising:
   100 parts by weight of a phenoxy resin having a bisphenol S skeleton in the structure thereof;
   5 to 30 parts by weight of a maleimide compound containing a plurality of maleimide groups in the structure thereof; and
   an inorganic needle-like filler in an amount ranging from 3 to 20 vol %,
   wherein the inorganic needle-like filler has a diameter of from 0.1 μm to 10 μm, a length of from 5 to 300 μm, and an aspect ratio of from 10 to 60.

2. The thermosetting adhesive composition according to claim 1,
   wherein the phenoxy resin has a structure represented by the following Formula (1):

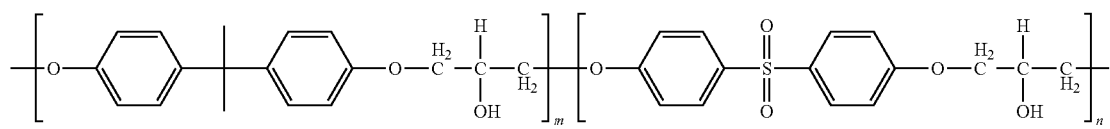

Formula (1)

where m and n each stand for an integer.

3. The thermosetting adhesive composition according to claim 2,
   wherein the phenoxy resin has an n/m molar ratio of from 3/7 to 5/5 and has a polystyrene-equivalent weight-average molecular weight of from 20000 to 60000.

4. The thermosetting adhesive composition according to claim 1,
   wherein the maleimide compound is at least one of maleimide compounds represented by the following Formulas (2) to (4):

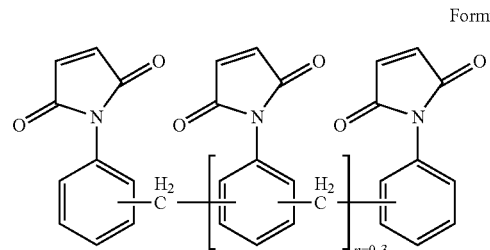

Formula (2)

Formula (3)

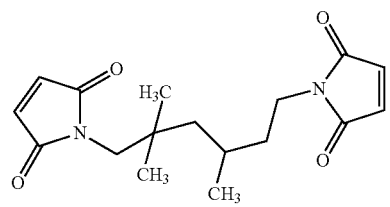

Formula (4)

where the term "n=0-3" in the Formula (2) means that at least any one of compounds having n of from 0 to 3 is contained.

5. The thermosetting adhesive composition according to claim 1,
   wherein the inorganic needle-like filler has been subjected to at least one adhesion enhancing pretreatment selected from hydrophilization treatment and coupling treatment.

6. The thermosetting adhesive composition according to claim 1,
   further comprising at least one adhesion enhancing agent selected from amine-based, vinyl-based, and isocyanate-based silane coupling agents in an amount of from 0.01 to 5 parts by weight.

7. The thermosetting adhesive composition according to claim 1,
   further comprising a plasticizer in an amount of from 1 to 30 parts by weight.

8. The thermosetting adhesive composition according to claim 7,
   further comprising a polymerization initiator which initiates polymerization or crosslink reaction of the plasticizer at a polymerization initiation temperature of 160° C. or greater.

9. A heat resistant adhesive film comprising:
   a polyimide film; and
   the thermosetting adhesive composition as claimed in claim 1 as an adhesive layer on one side or both sides of the polyimide film.

10. The heat resistant adhesive film according to claim 9,
    wherein the adhesive layer has a thickness of from 10 to 100 μm and the polyimide film has a thickness of from 25 to 100 μm.

11. A laminated film obtained by fusion bonding of the heat-resistant adhesive film as claimed in claim 9 and a conductor foil.

12. The laminated film according to claim 11,
    wherein the conductor foil has a thickness of from 9 to 35 μm.

13. A wiring film comprising:
    a first heat resistant adhesive film as claimed in claim 9 having the adhesive layer on one side of the polyimide film; a second heat resistant adhesive film as claimed in claim 9 having the adhesive layer on one side of the polyimide film, the second heat resistant adhesive film being located such that the adhesive layers of the first and second heat resistant adhesive films face each other; and a conductor wiring sandwiched between the adhesive layers of the first and second heat resistant adhesive films, wherein the adhesive layers of the first and second heat resistant adhesive films are bonded to each other.

14. The wiring film according to claim 13, wherein the conductor wiring has a thickness of 35 µm or greater.

15. The wiring film according to claim 13, wherein a plurality of the conductor wirings are disposed in the same plane.

16. The wiring film according to claim 13, wherein the adhesive layer is post-heated at a fusion bonding temperature or greater.

17. The wiring film according to claim 13, wherein the conductor wirings are copper wirings and at least a portion of an outer layer of the copper wirings is coated with at least one layer selected from the group consisting of a metal layer, a metal oxide layer, and a metal hydroxide layer, which includes at least one element selected from the group consisting of tin, nickel, zinc and cobalt.

18. The wiring film according to claim 13, wherein the conductor wirings are copper wirings and at least a portion of an outer layer of the conductor wirings is coated with a silane coupling agent containing an amino group, a vinyl group, a styryl group, an acrylate group, or a methacrylate group.

19. A wiring film comprising:
a first heat resistant adhesive film as claimed in claim 9 having the adhesive layer on both sides of the polyimide film; a second heat resistant adhesive film as claimed in claim 9 having the adhesive layer on one side of the polyimide film, the second heat resistant adhesive film being located such that the adhesive layer of the second heat resistant adhesive film and one adhesive layer of the first heat resistant adhesive film face each other; a third heat resistant adhesive film as claimed in claim 9 having the adhesive layer on one side of the polyimide film, the third heat resistant adhesive film being located such that the adhesive layer of the third heat resistant adhesive film and the other adhesive layer of the first heat resistant adhesive film face each other; and conductor wirings sandwiched between the adhesive layers of the first and second and the first and third heat resistant adhesive films; wherein the adhesive layers of the first and second and the first and third heat resistant adhesive films are bonded to each other.

\* \* \* \* \*